(12) United States Patent
Jang et al.

(10) Patent No.: US 12,523,357 B2
(45) Date of Patent: Jan. 13, 2026

(54) LIGHT EMITTING APPARATUS AND LIGHT EMITTING MODULE THAT INCLUDE AN ELECTRODELESS PAD ARRAY

(71) Applicant: SEOUL VIOSYS CO., LTD., Ansan-si (KR)

(72) Inventors: Bo Rami Jang, Ansan-si (KR); Jae Young Choi, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 18/672,442

(22) Filed: May 23, 2024

(65) Prior Publication Data

US 2024/0392954 A1 Nov. 28, 2024

Related U.S. Application Data

(60) Provisional application No. 63/468,823, filed on May 25, 2023.

(51) Int. Cl.
*F21V 19/00* (2006.01)
*F21Y 113/00* (2016.01)
(Continued)

(52) U.S. Cl.
CPC ...... *F21V 19/0025* (2013.01); *H01L 25/0753* (2013.01); *H01L 25/167* (2013.01); *H10H 20/856* (2025.01); *H10H 20/857* (2025.01); *F21Y 2105/18* (2016.08); *F21Y 2113/00* (2013.01); *F21Y 2115/10* (2016.08)

(58) Field of Classification Search
CPC ............. F21V 19/0025; H01L 25/0753; H01L 25/167; H10H 20/856; H10H 20/857
See application file for complete search history.

(56) References Cited

U.S. PATENT DOCUMENTS

| | | |
|---|---|---|
| 9,245,877 B2 | 1/2016 | Ko et al. |
| 9,961,770 B2 | 5/2018 | Dummer |

(Continued)

FOREIGN PATENT DOCUMENTS

| | | |
|---|---|---|
| CN | 210467885 U | 5/2020 |
| CN | 215771142 U | 2/2022 |
| WO | WO 2016/014357 A1 | 1/2016 |

OTHER PUBLICATIONS

International Search Report issued Aug. 30, 2024 in PCT/KR2024/007116, 4 pages.

(Continued)

*Primary Examiner* — Tracie Y Green

(74) *Attorney, Agent, or Firm* — Oblon, McClelland, Maier & Neustadt, L.L.P.

(57) ABSTRACT

A light emitting apparatus is disclosed. The light emitting apparatus includes: a base substrate; a plurality of circuits disposed on an upper side of the base substrate; a light emitting source included in at least one circuit among the plurality of circuits; a first pad and a second pad disposed on a lower side of the base substrate and contacting one electrode or another electrode of each of the plurality of circuits; and an electrodeless pad array disposed on the lower side of the base substrate. The number of electrodeless pads included in the electrodeless pad array is determined based on a number of the plurality of circuits.

9 Claims, 10 Drawing Sheets

(51) Int. Cl.
    *F21Y 115/10*     (2016.01)
    *H01L 25/075*     (2006.01)
    *H01L 25/16*     (2023.01)
    *H01L 33/60*     (2010.01)
    *H01L 33/62*     (2010.01)
    *H10H 20/856*     (2025.01)
    *H10H 20/857*     (2025.01)
    *F21Y 105/18*     (2016.01)

(56) References Cited

U.S. PATENT DOCUMENTS

| | | | |
|---|---|---|---|
| 10,256,385 B2* | 4/2019 | Britt | H10H 20/857 |
| 2013/0314920 A1 | 11/2013 | Park et al. | |
| 2014/0070235 A1* | 3/2014 | Andrews | H01L 24/85 |
| | | | 438/28 |
| 2015/0034978 A1* | 2/2015 | Hussell | H01L 25/0753 |
| | | | 257/89 |
| 2015/0207049 A1 | 7/2015 | Ko et al. | |
| 2015/0267906 A1 | 9/2015 | Wilcox | |
| 2017/0069606 A1 | 3/2017 | Gould et al. | |
| 2017/0373045 A1* | 12/2017 | Welch | H01L 25/0753 |

OTHER PUBLICATIONS

Extended European Search Report issued Oct. 25, 2024 in European Patent Application No. 24177969.3, 9 pages.

* cited by examiner (a)

(b)

(c)

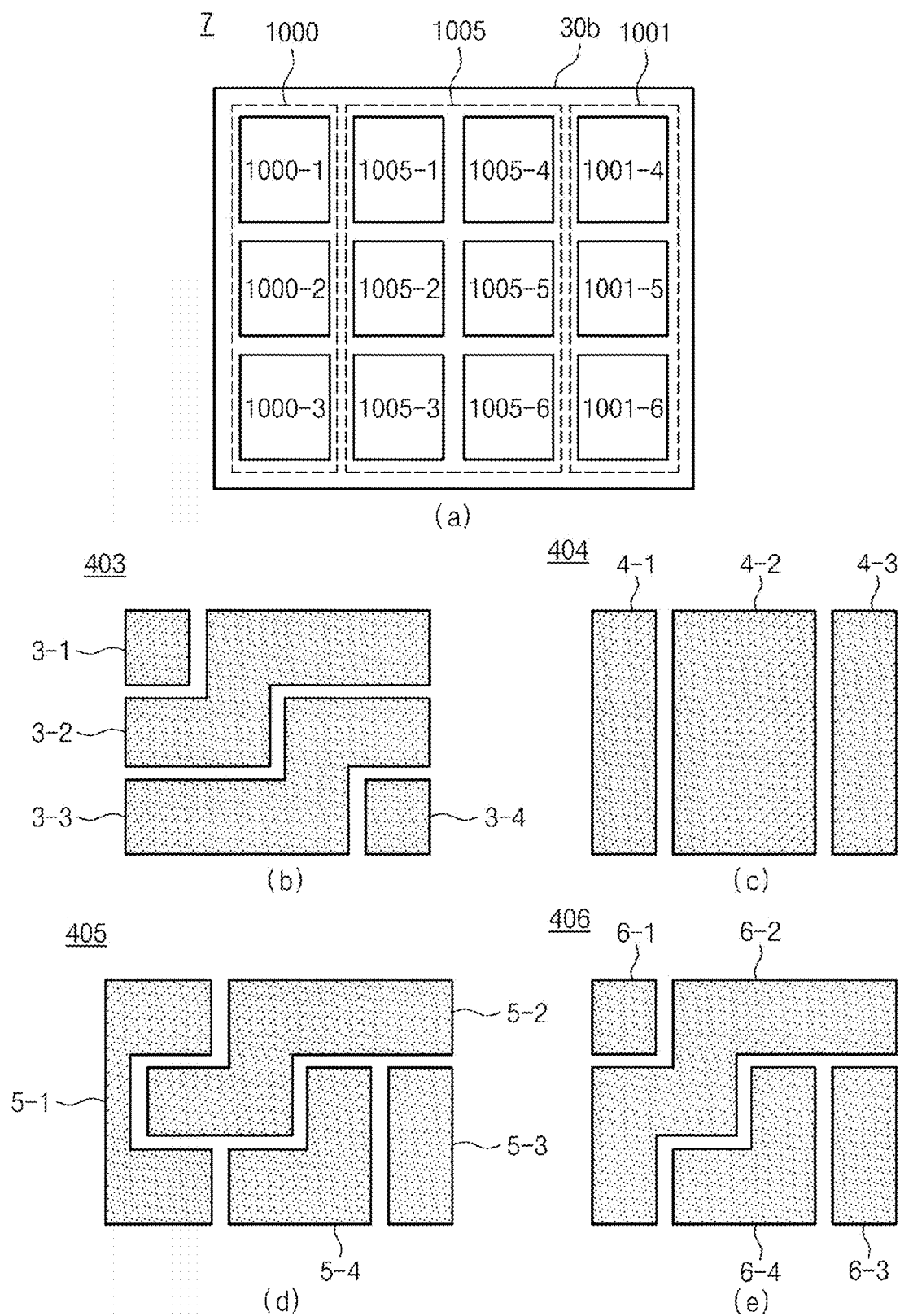

LIGHT EMITTING APPARATUS AND LIGHT EMITTING MODULE THAT INCLUDE AN ELECTRODELESS PAD ARRAY

CROSS-REFERENCE TO RELATED APPLICATION

This application claims priority from and the benefit of U.S. Provisional Patent Application No. 63/468,823, filed on May 25, 2023, which is hereby incorporated by reference for all purposes as if fully set forth herein.

BACKGROUND

Field

The present disclosure relates to a light emitting apparatus and a light emitting module.

Particularly, the present disclosure relates to a light emitting apparatus including multiple circuits and a light emitting module including the same.

More particularly, the present disclosure relates to a light emitting apparatus including an electrodeless pad array and a light emitting module including the same.

Background

Light emitting devices, for example, light emitting diodes, are inorganic semiconductor devices that emit light through recombination of electrons and holes, and have recently been used in various fields, for example, display devices, vehicular lamp s, general lighting, and the like. Since light emitting diodes have long lifespan, low power consumption, and fast response time, light emitting apparatuses including the light emitting diodes are expected to replace conventional light sources.

A light-emitting diode package may include two or more light-emitting diode devices, which may be connected to one another in series, parallel or series-parallel, as requested by consumers.

In typical package design for multiple light emitting diodes, since each light emitting diode is manufactured by previously determining circuit connection, such as series, parallel, or series-parallel connection in a package design process, there is a limited circuit configuration that can be used by users, and in series, parallel or series-parallel connection through external circuitry, the circuitry must be configured in a space with a larger area than a package or a stacked circuit board must be applied thereto, causing design difficulty and inefficient space utilization in consideration of a space of the package for the light emitting diodes.

SUMMARY

Embodiments of the present disclosure provide a light emitting apparatus including an electrodeless pad and a light emitting module including the same.

The problems to be solved by the present disclosure are not limited to the problems mentioned above, and other technical problems not mentioned will become apparent to a person having ordinary knowledge in the art from the following description.

In accordance with one aspect of the present disclosure, a light emitting apparatus includes: a base substrate; a plurality of circuits disposed on an upper side of the base substrate; a light emitting source included in at least one circuit among the plurality of circuits; a first pad and a second pad disposed on a lower side of the base substrate and contacting one electrode or another electrode of each of the plurality of circuits; and an electrodeless pad array disposed on the lower side of the base substrate, wherein a number of electrodeless pads included in the electrodeless pad array is determined based on a number of the plurality of circuits.

When the number of circuits is N, the number of electrodeless pads included in the electrodeless pad array may be less than or equal to a product of N and (N−1).

The electrodeless pads may be arranged in N rows and (N−1) columns.

The electrodeless pad array may have a larger area than the first pad or the second pad.

The electrodeless pad array may be disposed between the first pad and the second pad.

In accordance with another aspect of the present disclosure, a light emitting apparatus includes: a base substrate; a plurality of circuits disposed on an upper side of the base substrate; a light emitting source included in at least one circuit among the plurality of circuits; an integrated circuit (IC) device disposed in at least one circuit among the plurality of circuits; a first pad and a second pad disposed on a lower side of the base substrate and contacting one electrode or another electrode of each of the plurality of circuits; and an electrodeless pad array disposed on the lower side of the base substrate, wherein a number of electrodeless pads included in the electrodeless pad array is determined based on number of the plurality of circuits.

When the number of circuits is N, the number of electrodeless pads included in the electrodeless pad array may be less than or equal to a product of N and (N−1).

The electrodeless pads may be arranged in N rows and (N−1) columns.

The electrodeless pad array may have a larger area than the first pad or the second pad.

The electrodeless pad array may be disposed between the first pad and the second pad.

In accordance with a further aspect of the present disclosure, a light emitting apparatus includes: a base substrate; a plurality of circuits disposed on an upper side of the base substrate; a light emitting source included in at least one circuit among the plurality of circuits; a first pad and a second pad disposed on a lower side of the base substrate and contacting one electrode or another electrode of each of the plurality of circuits; and an electrodeless pad array disposed on the lower side of the base substrate, wherein a number of electrodeless pads included in the electrodeless pad array is determined based on a number of the plurality of circuits, and the light emitting apparatus may further include a wavelength converter converting a dominant wavelength of light emitted from a light source included in the light emitting source.

At least one circuit among the plurality of circuits may include an integrated circuit (IC) device.

When the number of circuits is N, the number of electrodeless pads included in the electrodeless pad array may be less than or equal to a product of N and (N−1).

The electrodeless pads may be arranged in N rows and (N−1) columns.

The electrodeless pad array may have a larger area than the first pad or the second pad.

The electrodeless pad array may be disposed between the first pad and the second pad.

In accordance with yet another aspect of the present disclosure, a light emitting apparatus includes: a base substrate; a plurality of circuits disposed on an upper side of the base substrate; a light emitting source included in at least one circuit among the plurality of circuits; a first pad and a second pad disposed on a lower side of the base substrate and contacting one electrode or another electrode of each of the plurality of circuits; and an electrodeless pad array disposed on the lower side of the base substrate, wherein a number of electrodeless pads included in the electrodeless pad array is determined based on a number of the plurality of circuits, and the light emitting apparatus may further include a circuit protector covering at least a region of the plurality of circuits.

The circuit protector may cover at least a region of the light emitting source and may have a light transmittance of 70% or more with respect to a dominant wavelength of light emitted from the light emitting source. Further, the circuit protector may include a protection device protecting at least one of the circuits.

At least one circuit among the plurality of circuits may include an integrated circuit (IC) device.

The light emitting apparatus may further include a wavelength converter converting a dominant wavelength of light emitted from a light source included in the at least a light emitting source.

When the number of circuits is N, the number of electrodeless pads included in the electrodeless pad array may be less than or equal to a product of N and (N−1).

The electrodeless pad may be arranged in N rows and (N−1) columns.

The electrodeless pad array may have a larger area than the first pad or the second pad.

The electrodeless pad array may be disposed between the first pad and the second pad.

In accordance with yet another aspect of the present disclosure, a light emitting apparatus includes: a base substrate; a plurality of circuits disposed on an upper side of the base substrate; a light emitting source included in at least one circuit among the plurality of circuits; a reflector surrounding at least a region of the light emitting source; a first pad and a second pad disposed on a lower side of the base substrate and contacting one electrode or another electrode of each of the plurality of circuits; and an electrodeless pad array disposed on the lower side of the base substrate, wherein a number of electrodeless pads included in the electrodeless pad array may be determined based on a number of the plurality of circuits.

The light emitting apparatus may further include a circuit protector covering at least a region of the plurality of circuits.

The circuit protector may cover at least a region of the light emitting source and may have a light transmittance of 70% or more with respect to a dominant wavelength of light emitted from the light emitting source. Further, the circuit protector may cover a protection device protecting at least one circuit among the plurality of circuits.

At least a circuit among the plurality of circuits may include an integrated circuit (IC) device.

The light emitting apparatus may further include a wavelength converter converting a dominant wavelength of a light source included in the a light emitting source.

When the number of circuits is N, the number of electrodeless pads included in the electrodeless pad array may be less than or equal to a product of N and (N−1).

Preferably, the electrodeless pads may be arranged in N rows and (N−1) columns.

The electrodeless pad array may have a larger area than the first pad or the second pad.

The electrodeless pad array may be disposed between the first pad and the second pad.

In accordance with yet another aspect of the present disclosure, a light emitting module includes: a base substrate; a plurality of circuits disposed on an upper side of the base substrate; a plurality of sub-pads disposed on a lower side of the base substrate and contacting one electrode or another electrode of each of the plurality of circuits; at least one of the electrodeless pads disposed on the lower side of the base substrate; and a module substrate connecting the plurality of sub-pads to the at least one electrodeless pad.

The plurality of circuits may include a first circuit and a second circuit, and a sub-pad connected to the other electrode of the first circuit may be connected to a sub-pad connected to one electrode of the second circuit and at least a region of the at least a electrodeless pad through the module substrate.

The plurality of circuits may further include a third circuit; a sub-pad connected to one electrode of the third circuit may be connected to a sub-pad connected to one electrode of the first circuit or the second circuit through the module substrate; and a sub-pad connected to the other electrode of the third circuit may be connected to a sub-pad connected to the other electrode of the first circuit or the second circuit through the module substrate.

The plurality of circuits may include a first circuit and a second circuit; a sub-pad connected to one electrode of the first circuit may be connected to a sub-pad connected to one electrode of the second circuit through the module substrate; and a sub-pad connected to the other electrode of the first circuit may be connected to a sub-pad connected to the other electrode of the second circuit through the module substrate.

The plurality of circuits may further include a third circuit; a sub-pad connected to one electrode of the third circuit may be connected through the module substrate to the at least electrode pad and a sub-pad connected to the other electrode of the first circuit and the other electrode of the second circuit, or a sub-pad connected to the other electrode of the third circuit may be connected through the module substrate to the at least electrode pad and a sub-pad connecting one electrode of the first circuit to one electrode of the second circuit.

The light emitting module may include at least one of the integrated circuit (IC) devices disposed on at least a surface of the base substrate or the module substrate.

The light emitting module may further include a circuit protector disposed on at least a surface of the base substrate and protecting at least a circuit among the plurality of circuits.

In accordance with yet another aspect of the present disclosure, a light emitting module includes: a module substrate; an electrode pattern disposed on the module substrate; and a plurality of light emitting apparatuses disposed in one region of the module substrate, at least one of the plurality of light emitting apparatuses including a base substrate; circuitry disposed on the base substrate and including a first circuit and a second circuit independently driven; a pad array disposed on a lower side of the base substrate and connected to one electrode and another electrode of the circuitry; and an electrodeless pad array not directly connected to the circuitry, wherein the pad array includes a plurality of pads and the electrodeless pad array is disposed between the plurality of pads, the pad array including a first pad electrically connected to one electrode of the first circuit, a second pad electrically connected to the other electrode of the first circuit, a third pad electrically connected to one electrode of the second circuit, and a fourth pad electrically connected to the other electrode of the first circuit, and wherein the electrode pattern electrically connects the first circuit to the second circuit through the electrodeless pad array.

The second pad may be connected to the electrodeless pad array through the electrode pattern and the third pad may be connected to the electrodeless pad array through the electrode pattern.

The first pad and the third pad may be connected to each other through the electrode pattern, and the second pad and the fourth pad may be connected to each other through the electrode pattern.

At least one circuit among the plurality of circuits may include an integrated circuit (IC) device.

When the number of circuits is N, the number of electrodeless pads included in the electrodeless pad array may be less than or equal to a product of N and (N−1).

The electrodeless pads may be arranged in N rows and (N−1) columns.

The electrodeless pad array may have a larger area than the first pad or the second pad.

The above aspects of the present disclosure are only some of exemplary embodiments of the present disclosure and various embodiments reflecting technical features of the present disclosure may be derived and understood by a person having ordinary knowledge in the art from the following detailed description of the present disclosure.

Embodiments of the present disclosure can more efficiently realize series, parallel, or series-parallel configuration of multiple circuits according to consumer requests.

Advantageous effects to be obtained from the present disclosure are not limited to those mentioned above and other effects not mentioned herein will become apparent to a person having ordinary knowledge in the art.

BRIEF DESCRIPTION OF THE DRAWINGS

The accompanying drawings, which are included to provide a further understanding of the present disclosure, illustrate embodiments of the present disclosure and serve to explain the principles of the present disclosure together with the detailed description:

FIGS. 10A, 10B, 10C, 10D and 10E are exemplary views of a solder pad array of a light emitting apparatus including three circuits according to another embodiment of the present disclosure.

DETAILED DESCRIPTION

Figure 1:
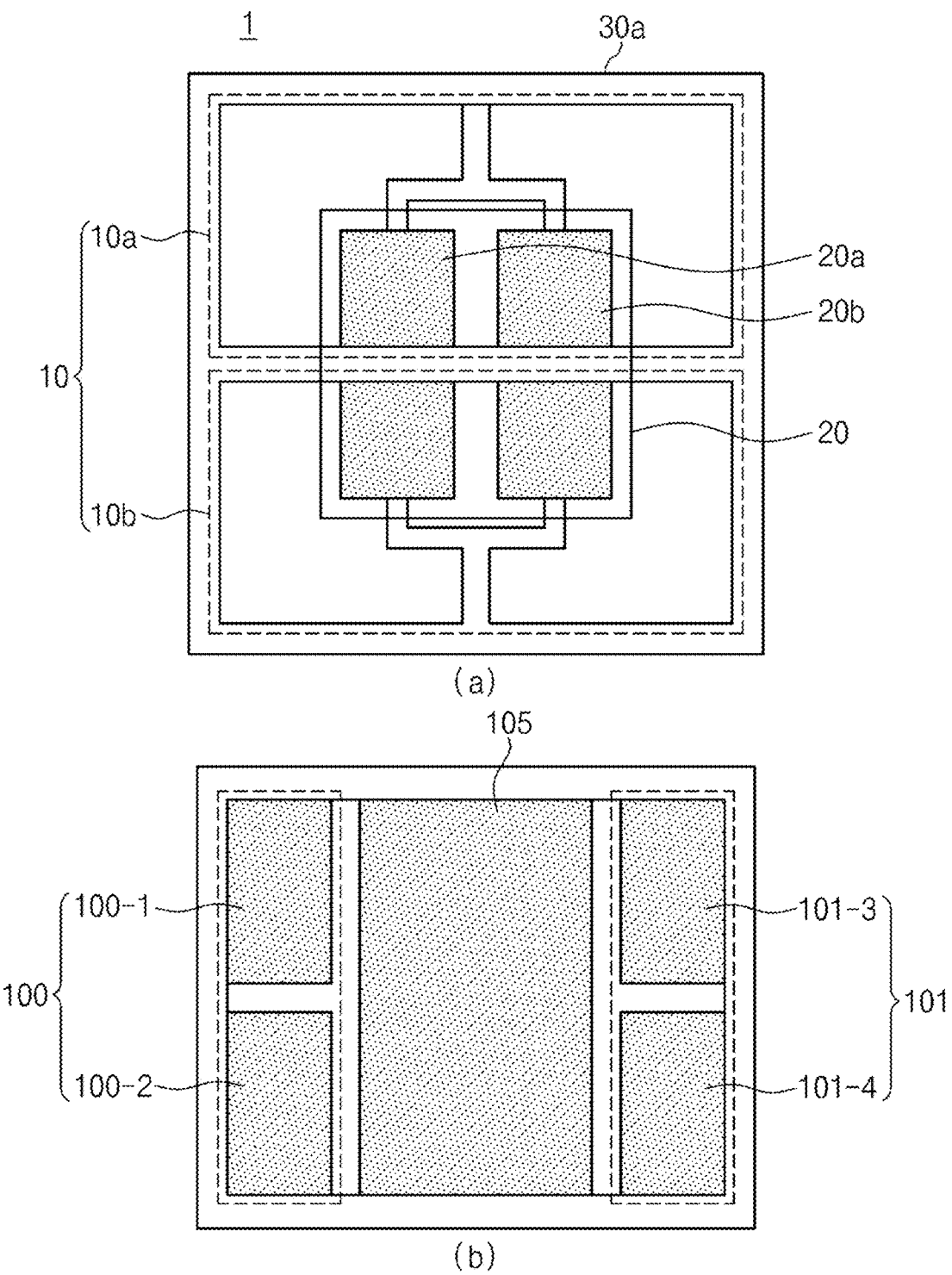
FIGS. 1A and 1B are exemplary views of a light emitting apparatus according to the present disclosure.

In the following description, for the purposes of explanation, numerous specific details are set forth in order to provide thorough understanding of various exemplary embodiments or implementations of the present disclosure. As used herein, "embodiments" and "implementations" are interchangeable terms for non-limiting examples of devices or methods employing one or more of the inventive concepts disclosed herein. It will be apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects (hereinafter individually or collectively referred to as "elements") of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, and property of the elements, unless specified. Further, in the accompanying drawings, the size and relative sizes of elements may be exaggerated for clarity and/or descriptive purposes. When an exemplary embodiment is implemented differently, a specific process order may be performed differently from the described order. For example, two consecutively described processes may be performed substantially at the same time or performed in an order opposite the described order. In addition, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the array consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (for example, as in "sidewall"), and the like, may be used herein for descriptive purposes, and, thereby, to describe one element's relationship to other element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (for example, rotated 90 degrees or at other orientations), and, as such, the spatially relative descriptors used herein may likewise interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or arrays thereof, but do not preclude the presence or addition of one or more other features, integers, steps, operations, elements, components, and/or arrays thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (for example, microcode) to perform various functions discussed herein and may optionally be driven by firmware and/or software. It is also contemplated that each block, unit, and/or module may be implemented by dedicated hardware, or as a combination of dedicated hardware to perform some functions and a processor (for example, one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is an exemplary view of a light emitting apparatus according to the present disclosure.

A light emitting apparatus 1 according to one embodiment of the present disclosure includes a base substrate, a circuitry 10, and pads 100, 101. The base substrate includes an upper region 30*a* of the base substrate and a lower region 30*b* of the base substrate. The base substrate may be manufactured to have high thermal conductivity and high reflection efficiency (with a material having these properties). For example, the base substrate may be formed of aluminum nitride (AlN) ceramic or $Al_2O_3$ ceramic, plastics including a polymer, or the like. The base substrate may be formed of acrylonitrile butadiene styrene (ABS), a liquid crystalline polymer (LCP), polyamide (PA), polyphenylene sulfide (IPS), or a thermoplastic elastomer (TPE), and a metallic material. By way of example, the base substrate may have a thermal conductivity of about 170 W/mk. In addition, materials, such as Cu, Ag, Au, Al, and the like, may be added (for example, coated or deposited) to the base substrate to improve reflection efficiency. However, the materials for the base substrate are not limited thereto and may include various materials, such as GaAs, GaN, Si, Al, Cu, and/or sapphire. In addition, the base substrate may have a minimum specific resistance of $2 \times 10^6$ Ωcm or more.

The circuitry 10 may be electrical paths along which electricity or signals may be delivered. That is, the circuitry 10 may include circuits as paths through which electricity travels. The circuitry 10 may be formed of a metal, such as Cu, Ag, Ni, Al, Au, Fe, W, and the like, a metal oxide, such as ITO (indium tin oxide), or a conductive material, such as graphene, carbon nanotubes, and the like, without being limited thereto. The circuitry 10 may have an electrical resistance of 100 Ω/cm or less. The circuitry 10 may include a plurality of circuits 10a, 10b and at least a circuit among the plurality of circuits 10a, 10b may include a light emitting source 20.

The light emitting source 20 may include at least a light emitting device. The light emitting device may generate and emit light through an active layer that is activated upon application of electric current. The light emitting device may include an LED chip. The LED chip may be an LED chip that generates light having wavelengths in a particular region, such as ultraviolet light, blue light, green light, yellow light, red light, infrared light, or the like. The pads 100, 101 may be electrically connected to the circuitry 10 to transmit an externally applied current, voltage, or electrical signal into the circuitry 10. The pads 100, 101 may include metals and materials, such as Cu, Ag, Ni, Al, Au, Fe, W, or compounds thereof, metal oxides including ITO (indium tin oxide), graphene, carbon nanotubes, and the like, which have low electrical resistance, and may be formed of the same material as the circuitry 10, without being limited thereto.

FIG. 1(a) shows an upper side of the light emitting apparatus 1 according to the embodiment of the present disclosure and FIG. 1(b) shows a lower side of the light emitting apparatus 1 according to the embodiment of the present disclosure.

Referring to FIG. 1(a), the upper region 30a of the base substrate includes a circuit region and a non-circuit region, and the circuitry 10 is disposed in the circuit region of the upper region 30a of the base substrate. The circuit region includes a conductive region and a non-conductive region, and may correspond to circuits of the circuitry 10. On the upper region 30a of the base substrate, the non-circuit region and the non-conductive region of the circuit region may include at least a material in common. For example, the non-circuit region and the non-conductive region of the circuit region may be composed of the same material. Alternatively, the conductive region of the circuit region may include at least a different material than the non-circuit region. The non-circuit region of the upper region 30a of the base substrate may surround at least a region of the circuit region. At least a region of a non-conductive region of the circuit region may be connected to the non-circuit region. The circuit region and the non-circuit region of the upper region 30a of the base substrate may have different shapes or sizes. The circuit region and the non-circuit region may have different areas. In the circuit region of the upper region 30a of the base substrate, the conductive region and the non-conductive region may have different shapes or sizes. The circuit region of the upper region 30a of the base substrate may include a plurality of conductive regions and one or more non-conductive regions may be disposed between adjacent conductive regions among the plurality of conductive regions. Here, the non-conductive region may isolate circuits of adjacent conductive regions. The circuit regions may be spaced apart from each other by the non-conductive regions. The upper region 30a of the base substrate may include a plurality of circuit regions.

The circuitry 10 may include a plurality of circuits 10a, 10b, in which at least a circuit may include a light emitting source 20. In FIG. 1(a), the circuitry 10 includes a first circuit 10a and a second circuit 10b. The first circuit 10a and the second circuit 10b may be spaced apart from each other to be electrically isolated from each other on the upper region 30a of the base substrate. At least one of the first circuit 10a or the second circuit 10b may include the light emitting source 20.

The light emitting source 20 is disposed on one circuit and may be disposed to include a region overlapping a region of each of the plurality of conductive regions and at least a non-conductive region in the circuit. The non-conductive region disposed in the overlapping region may divide the conductive regions to divide a flow of power or signals and may guide electric current or signals to flow through the light emitting source 20 disposed between the conductive regions such that the light emitting source 20 can be operated. In addition, one circuit may include a plurality of light emitting sources 20. When a plurality of light emitting sources 20 is disposed in one circuit, the plurality of light emitting sources 20 may be electrically or signally connected in common to at least a conductive region. Connection of the plural light emitting sources 20 to a common conductive region can secure a larger heat dissipation area than direct connection of the plurality of light emitting sources 20 to each other, thereby reducing the operation temperature of the light emitting sources 20 while improving reliability.

Each of the plurality of circuits 10a, 10b may include at least a light emitting source 20. Referring to FIG. 1(a), each of the plurality of circuits includes two light emitting sources and the circuit regions of the first and second circuits are symmetrical, without being limited thereto. Alternatively, the plurality of circuits 10a, 10b of the circuitry 10 may include different numbers of light emitting sources and may have different sizes and shapes.

The light emitting source 20 may include a plurality of light emitting sources. Each of the plurality of light emitting sources may include a light source that generates and emits light. For example, the light source may include a light emitting diode. In particular, referring to FIG. 1, the first circuit 10a includes a first light emitting source 20a and a second light emitting source 20b. The first light emitting source 20a and the second light emitting source 20b may include light emitting diodes that emit light in the same color gamut. That is, the light emitting diode included in the first light emitting source 20a and the light emitting diode included in the second light emitting source 20b may emit light in the same color gamut. Alternatively, the first light emitting source 20a and the second light emitting source 20b may include light emitting diodes that emit light having different peak wavelengths. Alternatively, the first light emitting source 20a and the second light emitting source 20b may include light emitting diodes that emit light having different dominant wavelengths. Alternatively, the light emitting diodes included in the first light emitting source 20a and the second light emitting source 20b may emit light with a difference of 10 nm or less between the peak wavelength and the dominant wavelength. As such, the first light emitting source 20a and the second light emitting source 20b may have high color clarity.

At least a light emitting source of the first light emitting source 20a or the second light emitting source 20b may include a plurality of light emitting diodes. The plurality of light emitting diodes disposed in at least a light emitting source of the first light emitting source 20a or the second light emitting source 20b may include light emitting diodes that emit light in the same color gamut. Alternatively, the plurality of light emitting diodes may include light emitting diodes that emit light having different peak wavelengths. Alternatively, the plurality of light emitting diodes may include light emitting diodes that emit light having different dominant wavelengths. Alternatively, the plurality of light emitting diodes may emit light with a difference of 10 nm or less between the peak wavelength and the dominant wavelength, thereby providing high color clarity.

The light emitting source 20 may include a light emitting diode and a wavelength converter. The wavelength converter may be disposed in an exit path of light emitted from the light emitting diode. The wavelength converter may be disposed to cover at least a surface of the light emitting diode. The wavelength converter may include at least a type of fine particles converting wavelengths in a first wavelength band included in the wavelength band of light emitted from the light emitting device. The fine particles may include at least one of a first type particles converting the wavelength in the first wavelength band to a wavelength in a second wavelength band or a second type of particle converting the wavelength in the first wavelength band to a wavelength in a third wavelength band. The wavelength in the first wavelength band may be shorter than the wavelength in the second wavelength band, and the wavelength in the third wavelength band may be longer than the wavelength in the second wavelength band. Further, the wavelength in the first wavelength band may be shorter than the wavelength in the second wavelength band and the wavelength in the third wavelength band may be longer than the wavelength in the second wavelength band. For example, the wavelength in the first wavelength band may be a wavelength in the blue wavelength band, the wavelength in the second wavelength band may be a wavelength in the yellow or green wavelength band, and the wavelength in the third wavelength band may be a wavelength in the red wavelength band. The wavelength converter may also convert the dominant wavelength of light emitted from the light emitting diode.

The fine particles may include phosphor particles, quantum dots, organic dyes, or nonlinear optical converters. For example, the first type particles include wavelength-converting particles that emit light having a peak wavelength in the green or yellow wavelength band and may include at least one of quantum dots, LuAG particles, YAG particles, beta-SiAlON particles, nitride particles, silicate particles, halophosphide particles, or oxynitride particles, without being limited thereto. The second type particles may include red wavelength-converting particles that emit light having a peak wavelength in the red wavelength band, and may include at least one of quantum dots, nitride particles, such as CASN, CASON, and SCASN, silicate particles, sulfide particles, or fluoride particles, without being limited thereto.

The wavelength converter may be a film or sheet type wavelength converter, such as PIS (phosphor in silicon), PIG (phosphor in glass), and PIC (phosphor in ceramic). The wavelength converter may include silicone resins, such as methyl silicone or phenyl silicone, and may include an organic material, such as a fluoropolymer, an epoxy, polyphthalamide (PPA), polybutylene terephthalate (PBT), polycarbonate (PC), and the like, glass, such as borosilicate, aluminosilicate, soda-lime glass, and the like, and a material, such as fused quartz and the like.

A plurality of pads may be disposed on the lower region 30b of the base substrate. Referring to FIG. 1(b), a first pad 100, a second pad 101, and an electrodeless pad array 105 are disposed on the lower region 30b of the base substrate. The first pad 100 and the second pad 101 may have different electric polarities. Alternatively, the first pad 100 and the second pad 101 may have different functions. For example, the first pad 100 may have electrical polarity and the second pad 101 may transfer data signals. In addition, each of the first pad 100 and the second pad 101 may include a plurality of sub-pads 100-1, 100-2, 101-3, 101-4. The first pad 100 and the second pad 101 may be electrically connected to one electrode or the other electrode of the circuitry 10 disposed on the upper region 30a of the base substrate.

Referring to FIG. 1(b), the first pad 100 may be a anode pad and the second pad 101 may be an cathode pad. The first pad 100, which is the anode pad, may include a plurality of anode sub-pads, for example, a first sub-pad 100-1 and a second sub-pad 100-2, and the second pad 101, which is the cathode pad, may include a plurality of cathode pads, for example, a third sub-pad 101-3 and a fourth sub-pad 101-4. The plurality of sub-pads 100-1, 100-2, 101-3, 101-4 may be electrically connected to one electrode and the other electrode of each of the plurality of circuits 10 disposed on the upper region 30a of the base substrate. At least a light emitting source 20 disposed in at least a circuit may include one light emitting diode and may be configured as an independent circuit.

The anode sub-pads 100-1, 100-2 and the cathode sub-pads 101-3, 101-4 may be connected through the base substrate such that leads corresponding to each pad are exposed on an upper surface of the base substrate and the cathodes and the anodes of the one or more light emitting devices are connected to the leads.

For example, among the plurality of sub-pads 100-1, 100-2, 101-3, 101-4, the first sub-pad 100-1 may be electrically connected to one electrode of the first circuit 10a, the third sub-pad 101-3 may be electrically connected to the other electrode of the first circuit 10a, the second sub-pad 100-2 may be electrically connected to one electrode of the second circuit 10b, and the fourth sub-pad 101-4 may be electrically connected to the other electrode of the second circuit 10b.

Further, the plurality of sub-pads 100-1, 100-2, 101-3, 101-4 may have different functions. For example, the first sub-pad 100-1 and the third sub-pad 101-3 may have electrical polarity, and the second sub-pad 100-2 and the fourth sub-pad 101-4 may transfer data signals.

At least two sub-pads among the plurality of sub-pads 100-1, 100-2, 101-1, 101-2 may have substantially the same length on a surface thereof. At least two sub-pads among the plurality of sub-pads 100-1, 100-2, 101-1, 101-2 may have the same area. At least a region of a surface of the first sub-pad 100-1 may be disposed to face at least a region of a surface of the second sub-pad 100-2 and the first sub-pad 100-1 may be spaced apart from the second sub-pad 100-2 with a non-conductive material disposed therebetween. In addition, at least a region of a surface of the third sub-pad 100-3 may be disposed to face at least a region of a surface of the fourth sub-pad 100-4 and the third sub-pad 100-3 may be spaced apart from the fourth sub-pad 100-4 with a non-conductive material disposed therebetween. Further, the first sub-pad 100-1 and the fourth sub-pad 101-4 may not overlap each other.

The electrodeless pad array 105 is disposed on the lower region 30b of the base substrate and is not electrically connected to the circuitry 10 on the upper region of the base substrate in the vertical direction. The electrodeless pad array 105 is disposed between the first pad 100 and the second pad 101. A region of the electrodeless pad array 105 may be disposed to face a region of the first pad 100. Further, a region of the electrodeless pad array 105 may be arranged to face a portion of the second pad 101. With such arrangement, the electrodeless pad array 105 can be easily connected to the first pad 100 and the second pad 101.

Further, a region of the electrodeless pad array 105 may be disposed to face a surface of the first sub-pad 100-1. Further, another region of the electrodeless pad array 105 may be disposed to face a surface of the second sub-pad 100-2. Still another region of the electrodeless pad array 105 may be disposed to face a surface of the third sub-pad 101-3, and still another region of the electrodeless pad array 105 may be disposed to face a surface of the fourth sub-pad 101-4. In this way, at least a region of the electrodeless pad array 105 is arranged to face at least a pad, thereby facilitating construction of circuits, such as series connection, parallel connection, and the like, using the electrodeless pad array 105. When a circuit connected to the first pad 100 is connected to a circuit connected to the second pad 101 using the electrodeless pad array 105, circuitry construction can be easily obtained even in a relatively small area to narrow a gap between light emitting apparatuses, thereby improving luminous uniformity.

In addition, the electrodeless pad array 105 may be formed of a metal or a metal compound, such as aluminum, gold, silver, tungsten, iron, cast iron, stainless steel, zinc, copper, nickel, platinum, magnesium, silicon (Si), carbon steel, cast iron, bronze, lead, or the like, which can easily dissipate heat. Further, the electrodeless pad array 105 may have a larger area than the first pad 100 and the second pad 101. When the area of the electrodeless pad array 105 is increased, the circuitry 10 can reduce thermal resistance through increase in heat dissipation area while improving reliability and durability of the circuitry 10 through reduction in temperature of the circuitry 10 during operation.

Figure 2:
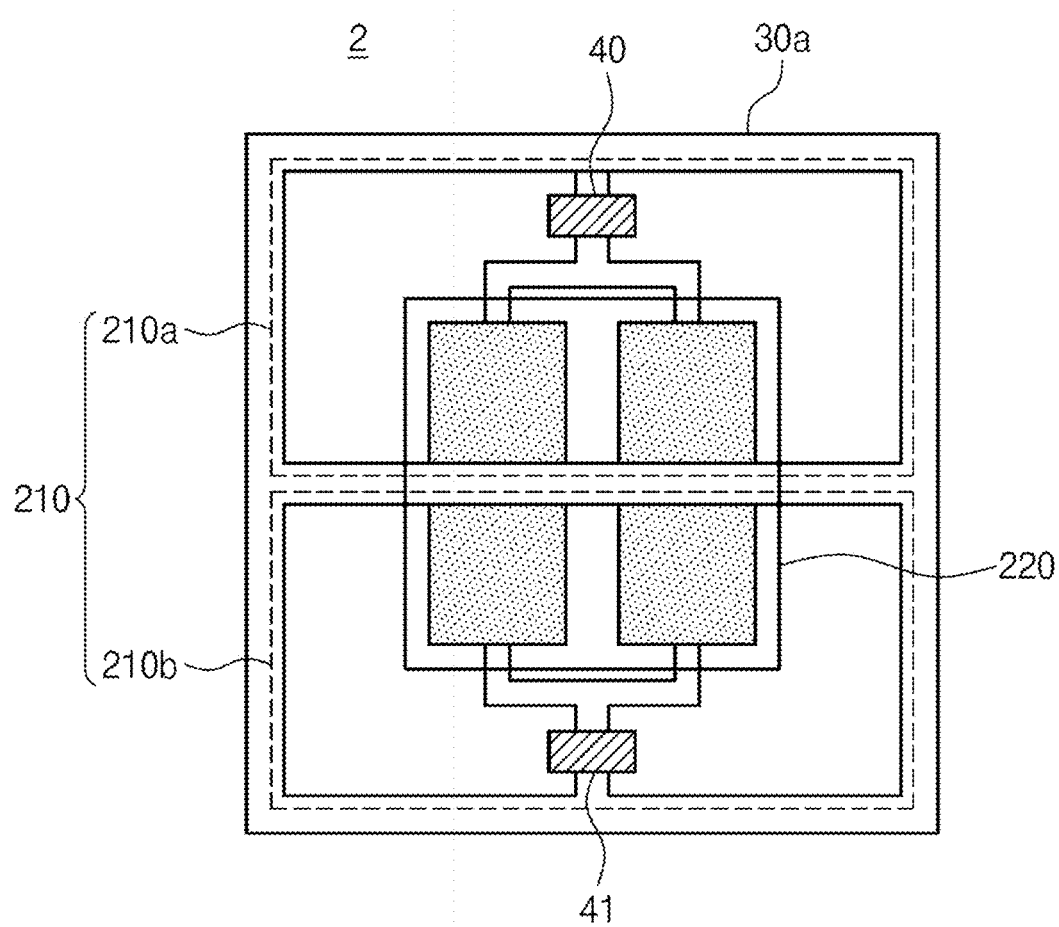
FIG. 2 is a top view of a light emitting apparatus including a protection device according to an embodiment of the present disclosure.

FIG. 2 is a top view of a light emitting apparatus 2 according to an embodiment of the present disclosure, in which the upper region 30a of the base substrate of FIG. 1 includes protection devices 40, 41. Further, FIG. 2 illustrates an example in which circuitry 210 includes a first circuit 210a and a second circuit 210b each including a light emitting source 220.

Referring to FIG. 2, at least a circuit of the circuitry 210 may include the protection devices 40, 41. Referring to FIG. 2, the first circuit 210a includes a first protection device 40 and the second circuit 210b includes a second protection device 41.

The protection devices 40, 41 may be electrically connected to one electrode or the other electrode of at least a circuit 210a and/or 210b. For example, the protection devices 40, 41 may be connected to an anode and a cathode of the light emitting source 220 included in the circuits 210a, 210b.

In addition, when the protection devices 40, 41 are unidirectional protection devices 40, 41, anodes of the protection devices 40, 41 may be electrically connected to cathodes of the circuitry 210 and cathodes of the protection devices 40, 41 may be electrically connected to anodes of the circuitry 210. For example, the anodes of the unidirectional protection devices 40, 41 may be electrically connected to the second pad 101, which is a cathode pad, and the cathodes of the unidirectional protection devices 40, 41 may be electrically connected to the first pad 100, which is an anode pad.

When each of the plurality of circuits 210a, 210b includes the unidirectional protection devices 40, 41, the anode of the first protection device 40 disposed in the first circuit 210a is electrically connected to the third sub-pad 101-3, which is an cathode pad, and the cathode of the first protection device 40 is electrically connected to the first sub-pad 100-1, which is a anode pad. The anode of the second protection device 41 disposed in the second circuit 210b may be electrically connected to the fourth sub-pad 101-4, which is an cathode pad, and the cathode of the second protection device 41 may be electrically connected to the third sub-pad 100-2, which is an anode pad.

When the protection devices 40, 41 are bidirectional protection devices, there is no difference in polarity between the protection devices 40, 41. Thus, one electrode of the protection devices 40, 41 is connected to one electrode of the circuitry 210 and the other electrode of the protection devices 40, 41 is connected to the other electrode of the circuitry 210. That is, one electrode of the protection devices 40, 41 may be electrically connected to the first pad 100 and the other electrode of the protection devices 40, 41 may be connected to the second pad 101.

As such, at least one of the protection devices 40, 41 are disposed in at least a circuit 210a and/or 210b of the circuitry 210, whereby the circuitry 210 can be prevented from being electrically damaged by surge current and static electricity, thereby improving lifespan and reliability of the light emitting apparatus.

The protection devices 40, 41 may be realized by devices, such as Zener diodes, silicon avalanche diodes, overvoltage suppressors, and the like, which serve to protect the circuitry 210 by regulating breakdown voltage of the devices to control sudden flow of electric current through regulation of the content of impurity in a PN junction or PNP junction.

Figure 3:
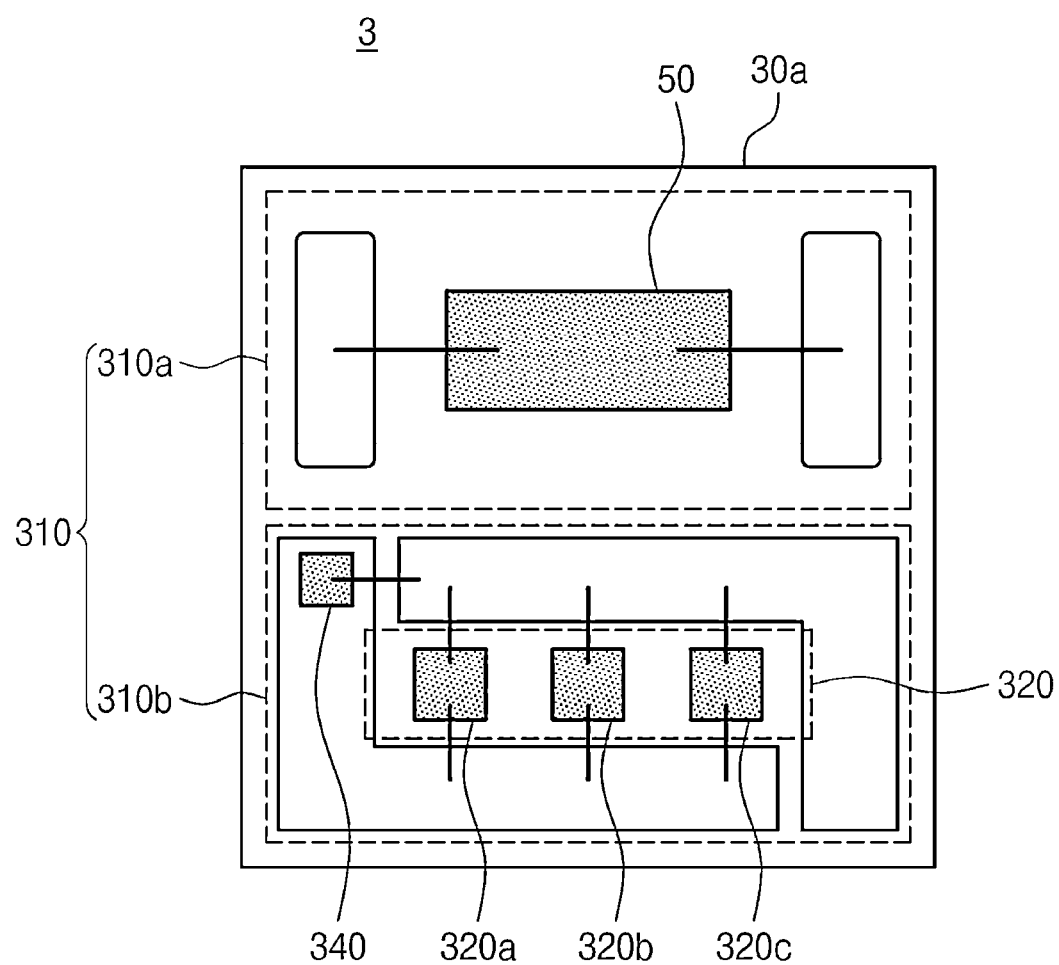
FIG. 3 is a top view of a light emitting apparatus including an integrated circuit according to an embodiment of the present disclosure.

FIG. 3 is a top view of a light emitting apparatus 3 according to a further embodiment of the present disclosure.

In particular, FIG. 3 illustrates an integrated circuit (IC) device 50 disposed on the upper region 30a of the base substrate shown in FIG. 1. In this embodiment, the lower region of the base substrate may have the same configuration as that shown in FIG. 1(b).

Referring to FIG. 3, the integrated circuit device 50 may include a control device for regulating operation of components in at least a region of a plurality of circuits 310a, 310b. For example, when at least a circuit among the plurality of circuits 310a, 310b includes a plurality of light emitting sources 320, the integrated circuit device 50 may include a control device for regulating operation of at least a light emitting source 320a, 320b and/or 320c of the light emitting sources 320.

FIG. 3 illustrates a plurality of circuits 310, in which a first circuit 310a includes the integrated circuit device 50 and a second circuit 310b includes the light emitting source 320. In particular, the light emitting source 320 includes a first light emitting source 320a, a second light emitting source 320b, and a third light emitting source 320c.

The integrated circuit device 50 may include a power management integrated circuit, a dimming controller, a driver, and the like for regulating operation of light emitting diodes of the light emitting source 320. In addition, the integrated circuit device 50 may include a device, such as a digital signal processor (DSP) or a microcontroller (MCU). By way of example, the integrated circuit device 50 may adjust brightness of one or more light emitting diodes. Further, monochromatic light can be output or various colors can be expressed by mixing two or more light by controlling two or more light emitting diodes. Further, colors with various color coordinates between different color coordinates of two or more light emitting diodes can be expressed by controlling the two or more light emitting diodes emitting light with the different color coordinates.

When the integrated circuit device 50 is connected to the first circuit 310a, as shown in FIG. 3, one electrode of the integrated circuit device 50 may be connected to the first sub-pad 100-1 of the first circuit 310a and the other electrode of the integrated circuit device 50 may be connected to the third sub-pad 101-3. Here, at least one of the first sub-pad 100-1 or the third sub-pad 101-3 connected to the integrated circuit device 50 may be connected to an input voltage, an output voltage, or the ground for electrical operation of the integrated circuit device 50. Here, the input voltage may be an input signal controlling operation of the integrated circuit device 50 and the output voltage may be an output signal output from the integrated circuit device 50 to control operation of another circuit, that is, the second circuit 310b.

By way of example, when the integrated circuit device 50 regulating operation of the light emitting device is connected to the first circuit 310a on the upper region 30a of the base substrate and the plurality of light emitting sources 20a, 20b, 20c is connected to the second circuit 310b, the pads 100, 101 on the lower region 30b of the base substrate may be configured as follows.

The first sub-pad 100-1 may receive an input signal for control of the integrated circuit device 50 and the third sub-pad 101-3 may be connected to the ground or may receive an output voltage output through control of the integrated circuit device 50. In addition, the second sub-pad 100-2 may receive an input voltage for operation of the second circuit 310b and the fourth sub-pad 101-4 may receive an operation signal of the second circuit 310b. The plurality of light emitting sources 320a, 320b, 320c in the second circuit 310b may include light emitting devices, such as red, blue, green and white light emitting diodes.

By way of example, in the structure wherein a drive IC is disposed in the first circuit 310a and three light emitting sources 320 with different color coordinates are disposed in the second circuit 310b such that, for example, a red light emitting device is disposed in the first light emitting source 320a, a blue light emitting device is disposed in the second light emitting source 320b, and a green light emitting device is disposed in the third light emitting source 320c, the integrated circuit device 50 outputs an output voltage of the third sub-pad 101-3 when an input signal is input to the integrated circuit device 50 on the first sub-pad 100-1. Here, an input voltage of the second sub-pad 100-3 may be adjusted according to the output of the programmed integrated circuit device 50 to control operation of the light emitting source 320 in the second circuit 310b.

For example, the light emitting apparatus 3 outputs red light upon operation of the first light source 320a by a signal input to the integrated circuit device 50, outputs blue light upon operation of only the second light emitting source 320b, and outputs green light upon operation of only the third light emitting source 320c. In addition, the light emitting apparatus 3 outputs magenta light upon simultaneous operation of the first light emitting source 320a and the second light emitting source 320b by a specific signal, outputs yellow light upon simultaneous operation of the first light emitting source 320a and the third light emitting source 320c, and outputs cyan light upon simultaneous operation of the second light emitting source 320b and the third light emitting source 320c. Furthermore, when drive current of each of the first light emitting source 320a, the second light emitting source 320b, and the third light emitting source 320c is controlled, the light emitting apparatus may output various colors located between inherent color coordinates of each of at least two light emitting sources.

In addition, by way of example, two light emitting sources emitting white light having different color temperatures may be disposed in the light emitting source 320, in which the first light emitting source 320a emits white light having a color temperature of 1,600K to 4,000K and the second light emitting source 320b emits white light having a color temperature of 7,000K to 4,000K. Accordingly, the light emitting apparatus may output white light in color coordinates between 1,600K and 7,000K through output regulation of the integrated circuit device 50.

In addition, not only when the light emitting sources 320a, 320b, 320c having different color coordinates are disposed, but also when two or more light emitting sources having the same color coordinate are disposed, the overall light intensity of the multi-circuit package can be adjusted through control of input and output signals of the integrated circuit device 50 and a light emission pattern with a narrow beam angle, a wide beam angle, or an intermediate beam angle can be realized through regulation of illumination zones of the light emitting sources 320, thereby providing various light profiles.

Referring to FIG. 3, the light emitting apparatus 3 may further include a protection device 340 in at least a circuit among the circuits 310a, 310b. The protection device 340 can prevent the circuits from being electrically damaged by surge current and static electricity, thereby improving lifespan and reliability of the light emitting apparatus.

As such, the integrated circuit device 50 may control operation of the components in the circuits 310 and protect the plurality of circuits 310 from problems, such as overvoltage, overcurrent, overheating, and the like, thereby improving reliability of the light emitting apparatus by preventing circuit damage caused by sudden changes in current or voltage.

Figure 4:
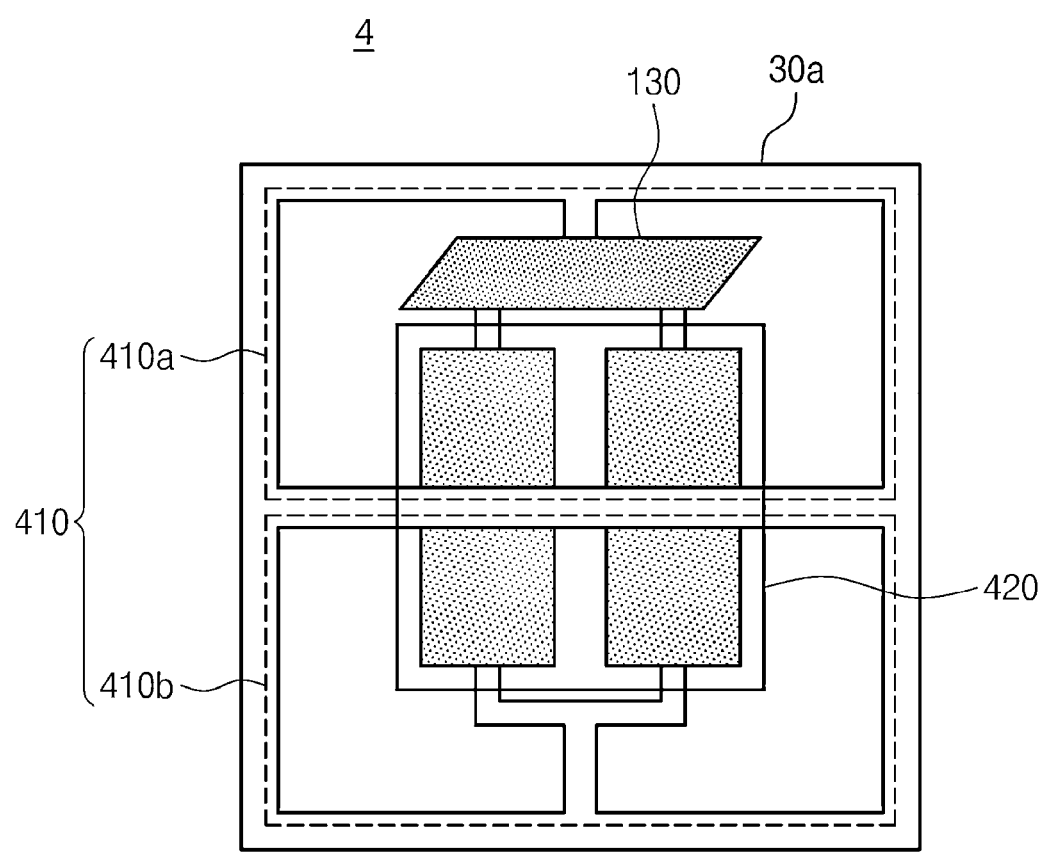
FIG. 4 is a top view of a light emitting apparatus including a reflector according to an embodiment of the present disclosure.

FIG. 4 is a top view of a light emitting apparatus 4 according to yet another embodiment of the present disclosure. FIG. 4 shows a reflector 130 formed on the upper region 30a of the base substrate shown in FIG. 1. In this embodiment, a lower region 30b of the base substrate may have the same configuration as that shown in FIG. 1(b).

Referring to FIG. 4, the light emitting apparatus 4 may be provided with the reflector 130 for changing a traveling path of light emitted from the light emitting source 20. FIG. 4 shows that circuitry 410 of the light emitting apparatus 4 includes a first circuit 410a and a second circuit 410b, in which each of the first circuit 410a and the second circuit 410b includes a light emitting source 420.

The reflector 130 may adjust the beam angle of light upon emission of light from the reflector 130. The reflector 130 may have a light reflectivity of 70% or more with respect to light emitted from the light emitting source 20. Alternatively, the reflector 130 may have a light reflectivity of 90% or more with respect to light in the blue wavelength band of light emitted from the light emitting source 20, without being limited thereto. The reflector 130 may include a material having reflectivity with respect to light emitted from the light emitting source 20, and may include at least a metallic material having high light reflectivity, such as Al, Cu, Au, Ag, and the like. The reflector 130 may include at least one of polymeric organic compounds, such as silicone resins, epoxy resins, polymer resins, fluoropolymer resins, and the like. The reflector 130 may further include various additives to increase light reflectivity, such as $TiO_2$, $Ba_2Ti_9O_{20}$, $BaSO_4$, $SiO_2$, $CaCO_3$, ZnO, $CaCO_3$, and the like.

The reflector 130 may be disposed to adjoin at least a region of the upper region 30a of the base substrate. The reflector 130 may be disposed to adjoin at least a region of the circuit region on the upper region 30a of the base substrate. The reflector 130 may be disposed to overlap at least a region of the conductive region on the upper region 30a of the base substrate. The reflector 130 may be disposed to overlap at least a region of the non-conductive region on the upper region 30a of the base substrate. The reflector 130 may be disposed to cover at least a region of the conductive region and at least a region of the non-conductive region on the upper region 30a of the base substrate. The reflector 130 may be disposed to surround at least a region of the conductive region and at least a region of the non-conductive region on the upper region 30a of the base substrate.

The reflector 130 may be disposed to overlap at least a region of a side surface of the light emitting source 420. The reflector 130 may form a wall/hill that surrounds at least a region of the light emitting source 420. By way of example, the wall/hill formed by the reflector 130 may partially adjoin or be spaced apart from the side surface of the light emitting source 420. At least a region of the wall/hill formed by the reflector 130 may include at least an inclined region. The reflector surrounding the light emitting source serves to adjust the beam angle of the light emitting apparatus 4 by changing the traveling path of light emitted from the light emitting source 420 in a certain direction and to reflect light directed around the light emitting source to travel in a forward direction, thereby preventing discoloration of the base substrate by light while improving luminous intensity and reliability of the light emitting apparatus 4.

The light emitting source 420 shown in FIG. 4 may be connected to the lower region 30b of the base substrate of FIG. 1(b) through the circuitry 410 and may have the same configuration as the light emitting source of FIG. 1.

Referring to FIG. 4, the light emitting apparatus 4 may further include protection devices 40, 41 in at least a circuit 410a and/or 410b among the plurality of circuits 410. When the light emitting apparatus 4 further includes the protection devices 40, 41, the protection devices 40, 41 may be electrically connected to one electrode and the other electrode of at least a circuit. For example, the protection devices 40, 41 may be connected to a anode and an cathode of the light emitting source 20. Further, when the protection devices 40, 41 are unidirectional protection devices 40, 41, anodes of the protection devices 40, 41 may be electrically connected to cathodes of the circuits 410 and cathodes of the protection devices 40, 41 may be electrically connected to anodes of the circuits 410. For example, the anodes of the unidirectional protection device 40, 41 may be electrically connected to the second pad 101 and the cathodes of the unidirectional protection device 40, 41 may be electrically connected to the first pad 100. When each of the plurality of circuits includes the unidirectional protection devices 40, 41, the anode of the first protection device 40 disposed in the first circuit 410a may be electrically connected to the third sub-pad 101-3 and the cathode of the first protection device 40 may be electrically connected to the first sub-pad 100-1. The anode of the second protection device 41 disposed in the second circuit 410b may be electrically connected to the fourth sub-pad 101-4 and the cathode of the second protection device 41 may be electrically connected to the second sub-pad 100-2. When the protection devices 40, 41 are bidirectional protection devices, there is no difference in polarity between the protection devices 40, 41. Accordingly, one electrode of the protection devices 40, 41 is connected to one electrode of the circuits 410a, 410b and the other electrode of the protection devices 40, 41 is connected to the other electrode of the circuits 410a, 410b. That is, one electrode of the protection devices 40, 41 may be electrically connected to the first pad 100 and the other electrode of the protection devices 40, 41 may be connected to the second pad 101. By further including the protection devices 40, 41, the light emitting apparatus 4 can improve reliability by preventing damage to the circuitry 10 caused by sudden change in current or voltage.

Referring to FIG. 4, the light emitting apparatus 4 may further include an integrated circuit device 50 to regulate operation of at least some components or the entirety of the circuitry 410. When the light emitting apparatus 4 further includes the integrated circuit device 50, the integrated circuit device 50 may be covered by the reflector 130. When the integrated circuit device 50 is disposed below the reflector 130, the reflector 130 may reflect light emitted from the light emitting source 20 and directed to the integrated circuit, thereby improving light output efficiency while preventing the integrated circuit device 50 from being damaged by light energy converted into light or heat.

Here, operation and circuit connection of the integrated circuit device 50 may be the same as that shown in FIG. 3.

Figure 5:
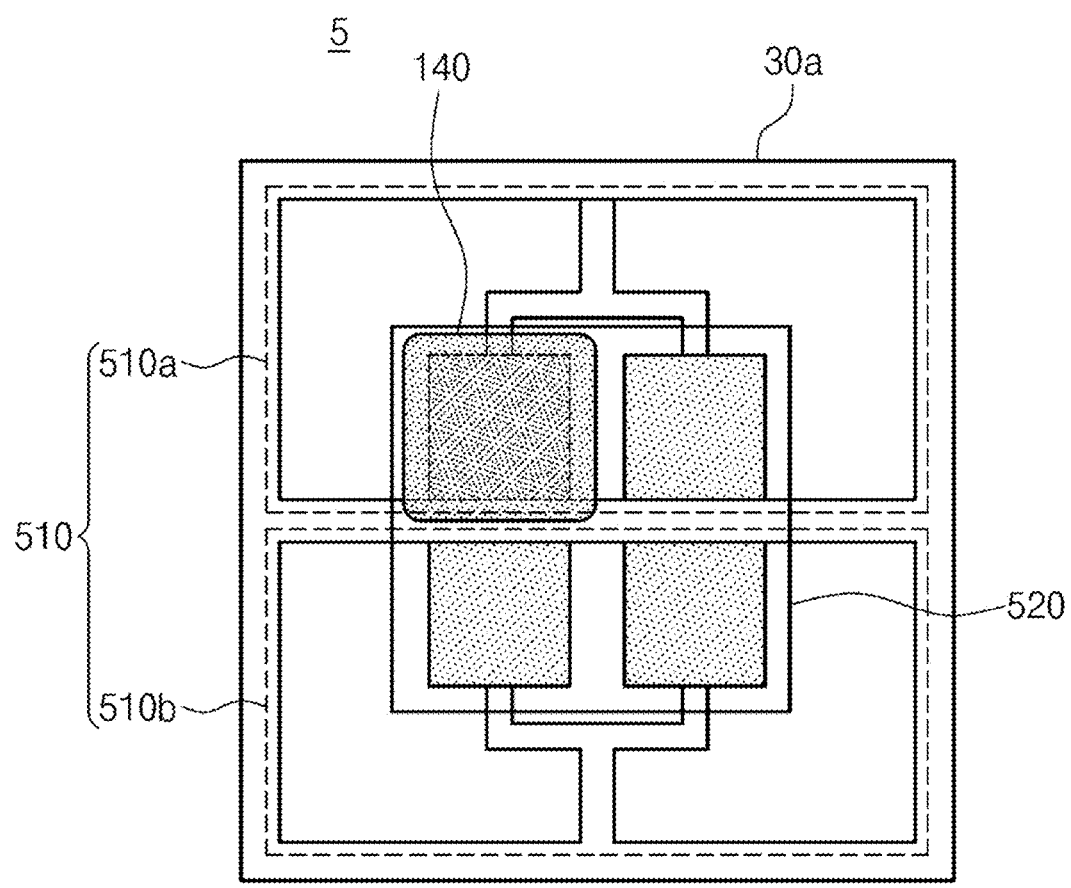
FIG. 5 is a top view of a light emitting apparatus including a circuit protector according to an embodiment of the present disclosure.

FIG. 5 is a top view of a light emitting apparatus 5 according to yet another embodiment of the present disclosure. FIG. 5 shows a circuit protector 140 formed on the upper region 30a of the base substrate shown in FIG. 1. In this embodiment, a lower region 30b of the base substrate may have the same configuration as that shown in FIG. 1(b). FIG. 5 shows the light emitting apparatus 5, in which circuitry 510 includes a first circuit 510a and a second circuit 510b and the circuits include a light emitting source 520. Here, a lower region 30b of the base substrate may be the same as that shown in FIG. 1(b).

Referring to FIG. 5, the light emitting apparatus 5 may include a circuit protector 140 for protecting the circuitry 510. The circuit protector 140 may be disposed in at least a region of the circuitry 510. The circuit protector 140 can protect at least a region of the circuitry 510 from an external environment, for example, pressure, temperature, humidity, dust, or the like.

The circuit protector 140 may be disposed to overlap at least a region of a circuit region of the circuitry 510. Referring to FIG. 5, the circuit protector 140 overlaps at least a region of the first circuit 510a.

The circuit protector 140 may be disposed to overlap a conductive region of at least a region of the circuit region. The circuit protector 140 may be disposed to overlap a non-conductive region of at least a region of the circuit region. The circuit protector 140 may be disposed to overlap at least a region of the conductive region and at least a region of the non-conductive region in the circuit region. The circuit protector 140 may be disposed to cover at least a region of the light emitting source 20. The circuit protector 140 may be disposed to overlap at least a region of the conductive region and at least a region of the non-conductive region in the circuit region and at least a region of the light emitting source 520. Accordingly, the circuit protector 140 can protect a region of the circuit region or the entirety thereof from an external environment. When the circuit protector 140 is disposed only in a region of the circuit region, the circuit protector 140 may be disposed so as not to block a light emitting surface of the light emitting source 520 such that the light traveling path is not blocked, thereby preventing deterioration in light extraction efficiency, or the circuit protector 140 may be disposed to increase adhesion between a lower portion of the light emitting source 520 and an upper region of the base substrate, thereby preventing the devices of the light emitting source 520 from being detached or damaged by external pressure or impact. Here, the circuit protector may be formed of an under-fill material using a polymer resin, an epoxy resin, a silicone resin, a urethane rein, or the like, without being limited thereto. In addition, when the circuit protector is disposed in the conductive region of the circuitry, the circuit protector can prevent the conductive region from being oxidized by external moisture or from being corroded by sulfur or chlorine, thereby maintaining resistance of the circuitry.

When the circuit protector 140 is disposed to cover the upper surface of the light emitting source 520, the circuit protector 140 may extract light emitted from the light emitting source 520 and adjust the beam angle and may be an encapsulation device that protects the light emitting source 520 or the conductive region of the circuit. The circuit protector 140 may include at least one of phenyl silicone, methyl silicone, epoxy, fused silica, borosilicate, soda-lime glass, aluminosilicate, fluoropolymer, polyphthalamide (PPA), polybutylene terephthalate (PBT), polycarbonate (PC), or EMC, all of which have light transmittance.

The circuit protector 140 may further include at least one of $TiO_2$, $Ba_2Ti_9O_{20}$, $BaSO_4$, $SiO_2$, $CaCO_3$, ZnO, $CaCO_3$, or the like, and can increase luminous efficacy by preventing light generated from the light emitting source 520 from being absorbed by a certain region of the circuitry 10 or by improving reflectivity with respect to light generated from the light emitting source 520. The circuit protector 140 may also include a material selected from silicon, carbon C, carbon nanotubes, silver, copper, aluminum and diamond to facilitate heat dissipation from the light emitting apparatus 5.

Referring to FIG. 5, the light emitting apparatus 5 may further include protection devices 40, 41 (see FIG. 2) on at least a circuit of the circuits 510a, 510b. The circuit protector 140 of the light emitting apparatus 5 may be disposed to cover at least a region of the protection devices 40, 41 (see FIG. 2), in which the circuit protector 140 can prevent the protection devices 40, 41 (see FIG. 2) from being damaged by an external environment. If the light emitting apparatus 5 further includes the protection devices 40, 41 (see FIG. 2), connection and role of the protection devices 40, 41 (see FIG. 2) may be similar to those described with reference to FIG. 2.

Referring to FIG. 5, the light emitting apparatus 5 may further include an integrated circuit device 50 (see FIG. 3) for regulation of operation of at least some components or the entirety of the circuitry 510. The circuit protector 140 of the light emitting apparatus 5 may be disposed to cover at least a region of the integrated circuit device 50 (see FIG. 3). The circuit protector 140 covering the region of the integrated circuit device 50 can protect the integrated circuit device 50 from the external environment, thereby improving reliability of the light emitting apparatus 5. In addition, heat generated upon operation of the integrated circuit device 50 (see FIG. 3) may be dissipated through the circuit protector 140 to reduce damage to the integrated circuit device 50 (see FIG. 3) caused by heat. Here, operation of the integrated circuit device 50 (see FIG. 3) and connection of the circuitry 510 are the same as described above in FIG. 3.

Referring to FIG. 5, the light emitting apparatus 5 may further include a reflector 130 (see FIG. 4). The reflector 130 (see FIG. 4) may be disposed to overlap at least a region of the conductive region of the circuitry 10. The circuit protector 140 of the light emitting apparatus 5 may be disposed to overlap a region of the reflector 130 (see FIG. 4) or the entire region thereof. By further including the reflective part 130, the light emitting apparatus 5 can prevent the reflector 130 (see FIG. 4) from being damaged by corrosive gases in an external environment, thereby preventing deterioration in reflectivity.

Referring to FIG. 5, the light emitting apparatus 5 may further include the protection devices 40, 41 (see FIG. 2), the integrated circuit device 50 (see FIG. 3), and the reflector 130 (see FIG. 4). The circuit protector 140 of the light emitting apparatus 5 may be disposed such that at least a region of the circuit protector 140 overlaps at least one of the protection devices 40, 41 (see FIG. 2), the integrated circuit device 50 (see FIG. 3), or the reflector 130 (see FIG. 4). The circuit protector 140 of the light emitting apparatus 5 may be disposed such that at least a region of the circuit protector 140 overlaps at least two of the protection devices 40, 41 (see FIG. 2), the integrated circuit device 50 (see FIG. 3), or the reflector 130 (see FIG. 4). The circuit protector 140 of the light emitting apparatus 5 may be disposed such that at least a region of the circuit protector 140 overlaps at least three of the protection devices 40, 41 (see FIG. 2), the integrated circuit device 50 (see FIG. 3), or the reflector 130 (see FIG. 4). Accordingly, the circuit protector 140 can protect the protection devices 40, 41 (see FIG. 2), the integrated circuit device 50 (see FIG. 3), and the reflector 130 (see FIG. 4) from change in an environment outside the light emitting apparatus 5 while improving reliability of the entire light emitting apparatus 5 by increasing a moisture penetration path.

Figure 6:
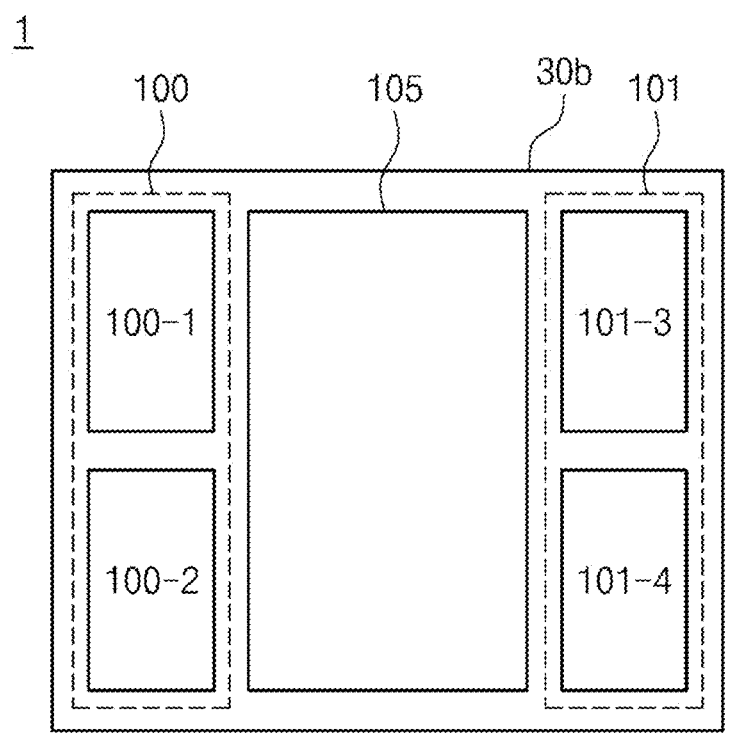
FIG. 6 is a conceptual view of a light emitting apparatus including two circuits according to an embodiment of the present disclosure.

FIG. 6 is a conceptual view of a lower region 30b of the base substrate of a light emitting apparatus according to an embodiment of the present disclosure, which includes two circuits. For convenience of description, it is assumed that an upper region 30a of the base substrate of the light emitting apparatus according to this embodiment includes a first circuit 10a and a second circuit 10b, as shown in FIG. 1(a).

Referring to FIG. 6, the pads of the lower region 30b of the base substrate of the light emitting apparatus are shown. In particular, the pads of the lower region 30b of the base substrate are shown as including a first pad 100 and a second pad 101.

One electrode of the first circuit 10a (see FIG. 1) may be electrically connected to the first sub-pad 100-1 of the first pad 100 and the other electrode of the first circuit 10a (see FIG. 1) may be electrically connected to the third sub-pad 101-3 of the second pad 101. One electrode of the second circuit 10b (see FIG. 1) may be electrically connected to the second sub-pad 100-2 of the first pad 100 and the other electrode of the second circuit 10b (see FIG. 1) may be electrically connected to the fourth sub-pad 101-4 of the second pad 101. One or the other electrode of the circuitry 10a, 10b (see FIG. 1) may be connected to the corresponding sub-pads 100-1, 100-2, 101-3, 101-4 through conductive structures, such as leads or conductive via-holes formed on the base substrate.

The first to fourth sub-pads 100-1, 100-2, 101-3, 101-4 and the electrodeless pad array 105 are spaced apart from each other and a non-conductive region is disposed in a separation region between adjacent sub-pads. Further, the first to fourth sub-pads 100-1, 100-2, 101-3, 101-4 and the electrodeless pad array 105 may be electrically isolated from each other and disposed on the lower region 30b of the base substrate. Thus, the first to fourth sub-pads 100-1, 100-2, 101-3, 101-4 and the electrodeless pad array 105 may be disposed on the lower region 30b of the base substrate without any adjoining regions therebetween.

The first sub-pad 100-1 and the second sub-pad 100-2 can have substantially the same area. Alternatively, the third sub-pad 101-3 and the fourth sub-pad 101-4 may have substantially the same area. Alternatively, the first sub-pad 100-1 and the third sub-pad 101-3 may have substantially the same area. Alternatively, the first sub-pad 100-1 and the fourth sub-pad 101-4 may have substantially the same area. Alternatively, the second sub-pad 100-2 and the third sub-pad 101-3 may have substantially the same area. Alternatively, the second sub-pad 100-2 and the fourth sub-pad 101-4 may have substantially the same area. Alternatively, all of the first through fourth sub-pads 101-1, 101-2, 101-3, 101-4 may have substantially the same area. Accordingly, a plurality of sub-pads 101-1, 101-2, 101-3, 101-4 can be insulated from each other and arranged on the lower region 30*b* of the base substrate having a limited area in an electrically stable structure.

The electrodeless pad array 105 is disposed between the first pad 100 and the second pad 101. The electrodeless pad array 105 is disposed on the lower region 30*b* of the base substrate and is not directly electrically connected to the circuitry 10 of the upper region 30*a* of the base substrate (see FIG. 1). In addition, as shown in FIG. 6, the electrodeless pad array 105 of the light emitting apparatus 1 including two circuits may be disposed adjacent to a region of at least one of the first pad 100 or the second pad 101 and may be spaced apart from the first pad 100 and the second pad 101 to be electrically isolated therefrom while being surrounded by the non-conductive region. When the electrodeless pad array 105 with no electrodes connected thereto is disposed between the two pads 100, 101, circuit connection through the electrodeless pad array 105, such as series connection or parallel connection, can be made to the module substrate described below, as needed. Accordingly, the freedom of circuit configuration of the module substrate can be increased and wiring through the electrodeless pad array 105 is allowed even in a narrow space, thereby improving luminous uniformity by reducing a distance between devices through improvement in space utilization.

In addition, the electrodeless pad array 105 may have a larger size than the first pad 100 and the second pad 101. When the electrodeless pad array 105 has a large size, the temperature of the circuitry can be lowered by increasing a heat dissipation area through the electrodeless pad array 105, thereby improving reliability. The electrodeless pad array 105 can further achieve the purpose of improving heat dissipation characteristics through heat dissipation and may include a metallic material, such as Cu, Ag, Al, Fe, Au, Ni, alloys thereof, or the like, which has minimum thermal conductivity greater than or equal to a predetermined value.

Figure 7:
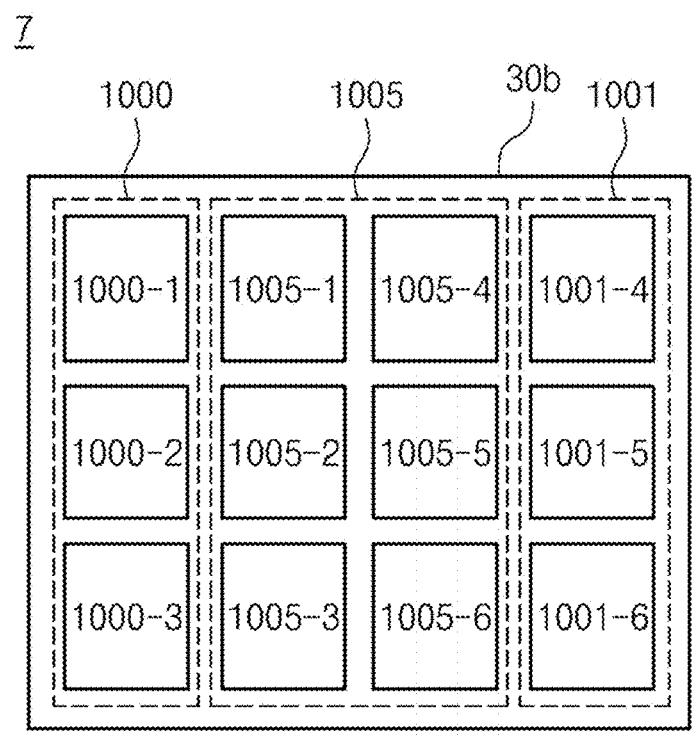
FIG. 7 is a conceptual view of a light emitting apparatus according to an embodiment of the present disclosure in which the number of circuits is increased.

FIG. 7 is a conceptual view of a lower region 30*b* of the base substrate of a light emitting apparatus 7 according to an embodiment of the present disclosure, which includes three circuits.

Referring to FIG. 7, the lower region 30*b* of the base substrate of the light emitting apparatus 7 may include a first pad 1000 and a second pad 1001. As described above, the plurality of circuits may be disposed on the upper region 30*a* of the base substrate, and the first pad 1000 and the second pad 1001 may be disposed on the lower region 30*b* of the base substrate. In addition, each of the plurality of circuits may include one electrode and the other electrode. The plurality of circuits may include a first circuit, a second circuit, and a third circuit. Each of the circuits may include a light emitting source 20 (see FIG. 1) or an integrated circuit device 50 (see FIG. 3), and one electrode and the other electrode of the circuitry 10 may be electrically connected to each of sub-pads 1000-1, 1000-2, 1000-3, 1001-4, 1001-5, 1001-6 of the lower region 30*b* of the base substrate through conductive structures, such as leads or via holes formed in the base substrate. Further, one electrode and the other electrode of each circuit and the sub-pads 1000-1 to 1000-3, 1001-4 to 1001-6 of the first pad 1000 and the second pad 1001 are spaced apart from each other by the non-conductive region.

Specifically, the first pad 1000 may include a first sub-pad 1000-1 electrically connected to one electrode of the first circuit, a second sub-pad 1000-2 electrically connected to one electrode of the second circuit, and a third sub-pad 1000-3 electrically connected to one electrode of the third circuit. The first sub-pad 1000-1, the second sub-pad 1000-2, and the third sub-pad 1000-3 of the first pad 1000 are disposed on the lower region 30*b* of the base substrate to be spaced apart from each other by the non-conductive region. Here, the sub-pads 1000-1, 1000-2, 1000-3 of the first pad 1000 may have the same length on at least a surface thereof. In addition, the sub-pads 1000-1, 1000-2, 1000-3 of the first pad 1000 may have the same area. The first sub-pad 1000-1 may be disposed to at least partially face the second sub-pad 1000-2. Further, the second sub-pad 1000-2 may be disposed to at least partially face the third sub-pad 1000-3. Furthermore, the first sub-pad 1000-1 and the third sub-pad 1000-3 may be disposed so as not to face each other.

Further, the second pad 1001 may include a fourth sub-pad 1001-4 electrically connected to the other electrode of the first circuit, a fifth sub-pad 1001-5 electrically connected to the other electrode of the second circuit, and a sixth sub-pad 1001-6 electrically connected to the other electrode of the third circuit. The fourth sub-pad 1001-4, the fifth sub-pad 1001-5, and the sixth sub-pad 1001-6 of the second pad 1001 are disposed on the lower region 30*b* of the base substrate to be spaced apart from each other by the non-conductive region. Here, the sub-pads 1001-4, 1001-5, 1001-6 of the second pad 1001 may have the same length on at least a surface thereof. In addition, the sub-pads 1001-4, 1001-5, 1001-6 may have the same area. The fourth sub-pad 1001-4 may be disposed to at least partially face the fifth sub-pad 1001-5. Further, the fifth sub-pad 1001-5 may be arranged to at least partially face the sixth sub-pad 1001-6. Furthermore, the fourth sub-pad 1001-4 and the sixth sub-pad 1001-6 may be disposed so as not to face each other.

Although three circuits are illustrated in FIG. 7, it should be noted that, as the number of circuits constituting the circuitry increases, the number of sub-pads of the first pad and the number of sub-pads of the second pad also increase in accordance with the number of circuits. For example, when the number of circuits of the light emitting apparatus is N, each of the number of sub-pads of the first pad and the number of sub-pads of the second pad is N.

With the configuration of the first pad and the second pad each including one electrode and the other electrode divided according to the number of circuits, local dimming is possible by independently operating each circuit, as needed, thereby reducing the blooming effect of a display. In addition, series, parallel or series-parallel connection between the sub-pads can be realized through metal bonding therebetween on the module substrate, which will be described below, thereby achieving increase in freedom of circuit configuration while reducing costs of product design through reduction in difficulty of circuit design on a product module substrate. Here, metal bonding may be realized through intermetallic bonding, solders, or adhesives containing metal particles, without being limited thereto.

The lower region 30*b* of the base substrate may be further provided with an electrodeless pad array 1005 disposed between the first pad 1000 and the second pad 1001. The electrodeless pad array 1005, the first pad 1000 and the second pad 1001 may be spaced apart from each other and the electrodeless pad array 1005 may be separated from the first and second pads 1000, 1001 by the non-conductive region. In addition, the electrodeless pad array 1005 is not directly connected to the circuits 1000, 1001 and may be used as wiring for circuit connection or as a heat dissipation pad, as needed. Specific examples of the electrodeless pad array 1005 used as the wiring and the heat dissipation pad will be described below.

The electrodeless pad array 1005 includes an array of electrodeless pads. Here, the size of the array, that is, the number of electrodeless pads, is determined based on the number of circuits to be mounted thereon.

Specifically, in a row direction, that is, in a direction parallel to the first pad 1000 or the second pad 1001, the number of electrodeless pads is equal to the number of circuits. In addition, in a column direction, that is, between the first pad 1000 and the second pad 1001, the number of electrodeless pads is one or more less than the number of circuits.

By way of example, when the light emitting apparatus includes two circuits, as shown in FIG. 6, the number of sub-pads of the first pad 100 (see FIG. 6) is 2, the number of sub-pads of the second pad 101 in FIG. 6) is 2, and the electrodeless pad array 105 (see FIG. 6) include 2 rows and 1 column, that is, 2 or fewer electrodeless pads. In other words, the number of electrodeless pads in the electrodeless pad array 105 (see FIG. 6) may be 2 or 1.

Further, when the light emitting apparatus includes three circuits as shown in FIG. 7, the number of sub-pads of each of the first pad 1000 and the second pad 1001 is 3 and the electrodeless pad array 1005 may include 3 rows and 2 columns, that is, 6 or fewer electrodeless pads. For example, when there are 6 electrodeless pads, the electrodeless pad array 1005 may include a first electrodeless pad 1005-1, a second electrodeless pad 1005-2, a third electrodeless pad 1005-3, a fourth electrodeless pad 1005-4, a fifth electrodeless pad 1005-5, and a sixth electrodeless pad 1005-6.

Further, when the light emitting apparatus includes 4 circuits, the number of sub-pads of each of the first pad and the second pad is 4 and the electrodeless pad array may include 4 rows and 3 columns, that is, 12 or fewer electrodeless pads. In addition, when the light emitting apparatus includes 5 circuits, the number of sub-pads of each of the first pad and the second pad is 5, and the electrodeless pad array may include 5 rows and 4 columns, that is, 12 or fewer electrodeless pads.

As such, when the number of circuits is N, the number of sub-pads of each of the first pad and the second pad is N and the electrodeless pad array may consist of N*(N−1) or fewer electrodeless pads.

As such, when the number of sub-pads of each of the first pad and the second pad is N according to the number of circuits N and the number of electrodeless pads of the electrodeless pad array is N*(N−1), consumers can design at least one of series connection, parallel connection or series-parallel connection on a module substrate, which will be described below, through a region of the lower region 30*b* of the base substrate rather than the upper region 30*a* of the base substrate using the electrodeless pad array in construction of a module or a circuit, as needed. Furthermore, a separate design process for wiring between the circuits on the upper region 30*a* of the base substrate can be omitted while securing improvement in design flexibility through construction of the circuits according to user demand and making it possible to mount additional light emitting sources through more efficient utilization of a space inside a package. Connection of the solder pads on the module substrate using the electrodeless pad array will be described below with reference to FIG. 9 and FIG. 10.

In addition, when the number of electrodeless pads is less than N*(N−1), the area of the non-conductive region separating the electrodeless pads from each other can be reduced and the area of the conductive region can be expanded to expand a heat dissipation area, thereby enabling decrease in operating temperature of the circuits while suppressing deterioration in reliability of the circuits due to heat.

Further, when the number of sub-pads is an even number, the number of electrodeless pads may be an odd number. Here, the electrodeless pads may have a larger area than the sub-pads, thereby increasing the heat spreading areas of the base substrate and the light emitting apparatus while reducing thermal resistance.

Furthermore, in FIG. 7, the electrodeless pads of the electrodeless pad array are arranged in a checkerboard shape in which both rows and columns are uniformly spaced. However, it should be understood that the electrode pads may be arranged in various shapes, such as a circular shape, an oval shape, a radial shape, a grid shape, a chessboard shape, and the like, depending on arrangement of the circuits on the upper region of the base substrate. As such, with the electrodeless pads arranged according to the arrangement of the circuits on the upper region of the base substrate, the light emitting apparatus can minimize a heat migration path along which heat generated from the circuits migrates through the electrodeless pads of the electrodeless pad array disposed below the circuits while reducing thermal resistance, thereby reducing thermal damage to the light emitting apparatus through reduction in temperature in operation of the circuits.

Figure 8:
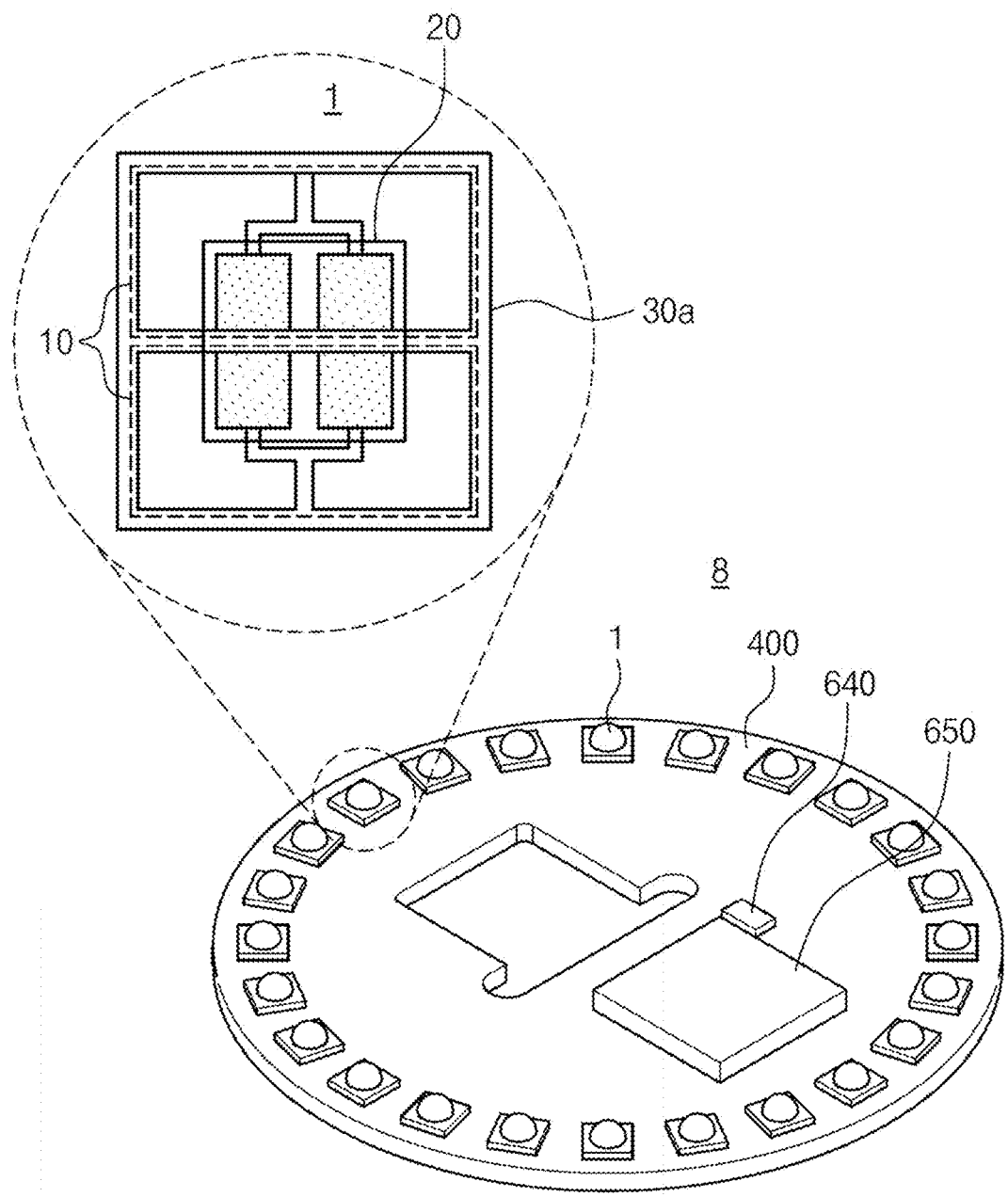
FIG. 8 is a conceptual view of a module substrate including light emitting apparatuses according to an embodiment of the present disclosure.

FIG. 8 is a conceptual view of a module substrate including light emitting apparatuses according to an embodiment of the present disclosure.

Referring to FIG. 8, a light emitting module 8 includes a module substrate 400 and a plurality of light emitting apparatuses 1 spaced apart from each other on a surface of the module substrate 400. Here, each of the light emitting apparatuses 1 includes the light emitting apparatus 1 shown in FIG. 1, FIG. 6, or FIG. 9, which includes two circuits 10. However, the light emitting apparatus 1 disposed on the module substrate 400 is not limited thereto and may include at least one of the light emitting apparatuses of the various embodiments described above. Each of the light emitting apparatuses 1 may include a plurality of circuits 10, which are disposed on the upper region 30*a* of the base substrate, and a plurality of pads 100, 101 (see FIG. 9) and an electrodeless pad array 105 (see FIG. 9), which are disposed on the lower region 30*b* of the base substrate (see FIG. 9). The light emitting apparatus 1 may include two or more circuits 10, in which at least a circuit 10 may include a light emitting source 20. The plurality of pads may include a first pad 100 (see FIG. 9) and a second pad 101 (see FIG. 9). The plurality of circuits 10 is electrically connected to the first pad 100 (see FIG. 9) and the second pad 101 (see FIG. 9) through solder pads (not shown) of the module substrate 400 and may be connected to each other in series, parallel, or series-parallel depending on connection between the first pad 100 (FIG. 9), the second pad 101 (FIG. 9), and the electrodeless pad array 105 (see FIG. 9). The configuration of the solder pads will be described below with reference to FIG. 9 and FIG. 10.

The module substrate 400 may be provided on a surface thereof with a protection device 640, an integrated circuit device 650, and at least one of a reflector 130 (see FIG. 4) or a circuit protector 140 (see FIG. 5).

The module substrate 400 may be a printed circuit board (PCB) on which circuits including electrode patterns are printed to allow the above devices to be disposed thereon and powered. The module substrate 400 may be formed of aluminum, copper, ceramics, or the like to facilitate heat dissipation and may be formed of paper board, epoxy, glass, or the like to increase structural flexibility. The integrated circuit device 650 disposed on the module substrate 400 may regulate operation of at least a light emitting apparatus 6 of the plurality of light emitting apparatuses 6 disposed on the module substrate 400 to improve light uniformity of the light emitting module 8 by controlling brightness uniformly. In addition, the integrated circuit device 650 of the light emitting module 8 may regulate operation of the light emitting apparatus 6 having two or more different color coordinates to express a color temperature between the two or more color coordinates. Further, the integrated circuit device 50 may stably regulate power applied to the circuits within the light emitting apparatus 6 to protect the circuits by preventing overcurrent or overvoltage from being applied to the circuitry 10.

The protection device 640 disposed on the module substrate 400 serves to protect the light emitting apparatus 6 or the integrated circuit device 650 from surge current or ESD (electrostatic discharge), and may include a Zener diode, TVS, and the like.

The reflector 130 (see FIG. 4) may be disposed to overlap each other on at least aa surface of the module substrate 400. Alternatively, the reflector 130 (see FIG. 4) may be disposed to overlap at least one of the plurality of light emitting apparatuses 6 disposed on the module substrate 400. Alternatively, the reflector 130 (see FIG. 4) may be disposed between adjacent light emitting apparatuses 6 on the module substrate 400. The reflector 130 (see FIG. 4) may be disposed on the module substrate 400 to change the traveling path of light emitted from the light emitting apparatus 6 or to adjust the beam angle. Further, the reflector 130 (see FIG. 4) may cover at least a surface of the integrated circuit device 650 or the protection device 640 to improve light extraction efficiency through reduction of light absorption.

Figure 9:
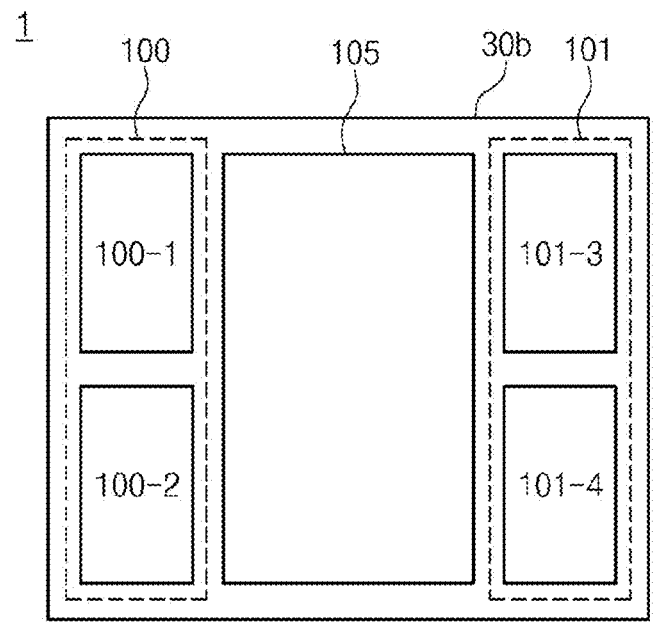
FIGS. 9A, 9B, and 9C are exemplary views of a solder pad array of a light emitting apparatus including two circuits according to one embodiment of the present disclosure.
Figure 9:
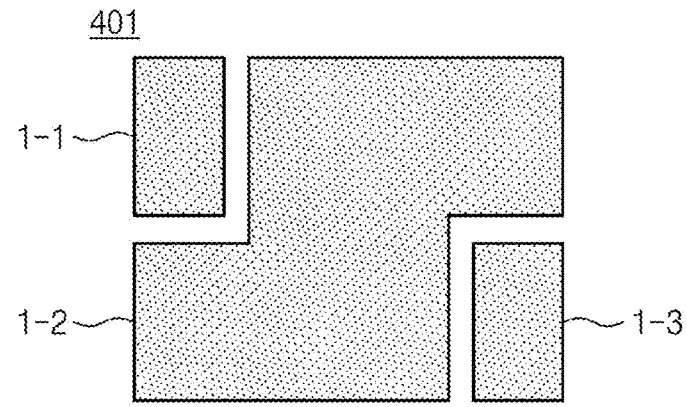
Figure 9:
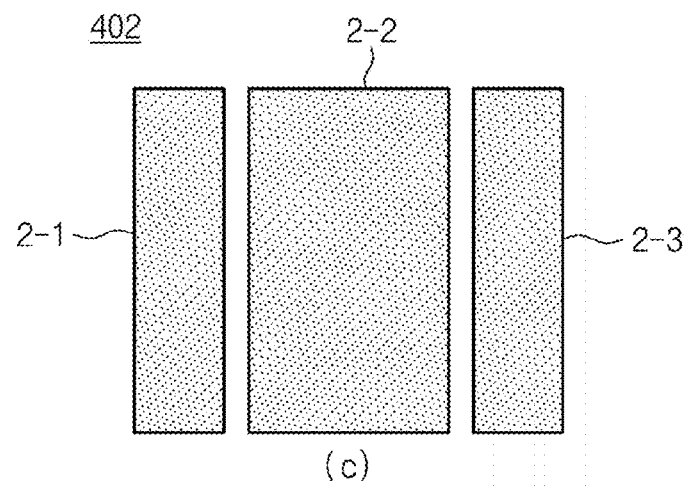

FIG. 9 is exemplary views of a solder pad array on a module substrate of a light emitting module according to one embodiment of the present disclosure.

In particular, FIG. 9 assumes that the light emitting apparatus mounted on the module substrate 400 includes two circuits and FIG. 9(a) illustrates a pad configuration of the light emitting apparatus. The pad configuration illustrated in FIG. 9(a) and features thereof are the same as those described with reference to FIG. 6. Further, the light emitting apparatus shown in FIG. 9 has the same configuration as the light emitting apparatus 1 shown in FIG. 1, FIG. 6 and FIG. 8, and the light emitting module has the same configuration as the light emitting module 8 including the module substrate 400 and the light emitting apparatus 1 shown in FIG. 8.

A surface of the module substrate 400 (see FIG. 8) may include a conductive region and a non-conductive region. The conductive region of the module substrate 400 (see FIG. 8) may include a solder pad. The solder pad array of the module substrate may become an electrode pattern connecting the light emitting apparatuses 1. The solder pad of the module substrate 400 (see FIG. 8) may include a plurality of solder pads corresponding to the circuit configuration of the light emitting apparatus 6 (see FIG. 8) mounted on the module substrate 400 (see FIG. 8).

Referring to FIG. 9, the two circuits 10 (see FIG. 8) included in the light emitting apparatus 1 (see FIG. 8) may be connected to each other in series or in parallel depending on the solder pad array formed on the module board 400 (see FIG. 8).

FIG. 9(b) illustrates a solder pad array 401 of the module substrate 400 (see FIG. 8) according to one embodiment and FIG. 9(c) illustrates a solder pad array 402 of the module substrate 400 (see FIG. 8) according to another embodiment.

When two circuits 10 (see FIG. 8) of the light emitting apparatus 1 (see FIG. 8) are connected in series, the solder pad array 401 of the module substrate 400 includes a first solder pad 1-1, a second solder pad 1-2, and a third solder pad 1-3, as shown in FIG. 9(b). The first-1 solder pad 1-1 is connected to the first sub-pad 100-1 of the light emitting apparatus 1 (see FIG. 6) through metal bonding, the first-2 solder pad 1-2 is connected to the second sub-pad 100-2, the third sub-pad 101-3, and the electrodeless pad array 105 of the light emitting apparatus 1 (see FIG. 6) through metal bonding, and the first-third solder pad 1-3 is connected to the fourth sub-pad 101-4 of the light emitting apparatus (FIG. 6) through metal bonding to connect the circuits 10 (see FIG. 8) of the light emitting apparatus (FIG. 8) in series. The diagonally arranged sub-pads 100-2, 101-3 can be easily connected in series through the electrodeless pad array 105 and the first-2 solder pad 1-2. Since connection of the circuits 10 (see FIG. 8) through the electrodeless pad array 105 and the solder pad array 401 shown in FIG. 9(b) can be made through a lower side of the light emitting apparatus 1 (see FIG. 8), a wiring region can be shortened to reduce interference between the circuits and circuit connection through jumpers or via holes can be omitted to reduce difficulty of circuit configuration.

FIG. 9(c) illustrates a solder pad array 402 of the light emitting module for parallel connection of two circuits 10 of the light emitting apparatus 1 (see FIG. 8). In this embodiment, the module substrate 400 (see FIG. 8) includes a second-1 solder pad 2-1, a second-2 solder pad 2-2, and a second-3 solder pad 2-3. The second-1 solder pad 2-1 is connected to the first sub-pad 100-1 and the second sub-pad 100-2 through metal bonding, the second-2 solder pad 2-2 is connected to the electrodeless pad array 105 through metal bonding, and the second-3 solder pad 2-3 is connected to the third sub-pad 101-3 and the fourth sub-pad 101-4 through metal bonding. In this way, when the sub-pads facing each other are connected to each other through the solder pad array 402 shown in FIG. 9(c), the circuits 10 (see FIG. 8) of the light emitting apparatus 1 may be connected to each other in parallel.

Since such circuit configuration allows connection of the circuits through the lower side of the light emitting apparatus 1 using the solder pad array of the module substrate, the wiring region can be shortened and a metal bonding area can be increased to facilitate heat dissipation.

Referring to FIG. 9(c), the electrodeless pad array 105 is connected to the second solder pad 2-2. Alternatively, the electrodeless pad array 105 may be connected to either the second solder pad 2-1 or the third solder pad 2-3 through metal bonding to improve heat stability through increase in heat dissipation area.

Further, when the circuits are connected to each other through the first pad 100, the second pad 101, and the electrodeless pad array 105, as shown in FIG. 9, a light emitting apparatus including series or parallel connection can be realized by connecting the pads 100, 101, 105 through the solder pad arrays 401, 402 on the module substrate 400 according to consumer requests without separate connection between the circuits on the upper region of the base substrate at a design stage of the light emitting apparatus.

FIG. 10 is exemplary views of a solder pad array of a module substrate according to another embodiment of the present disclosure.

Referring to FIG. 10, three circuits included in the light emitting apparatus may be connected to each other in series, parallel, or series-parallel.

The light emitting apparatus 7 shown in FIG. 10 has the same configuration as the light emitting apparatus 7 including the three circuits of FIG. 7. In addition, a module substrate 400 shown in FIG. 10 has the same configuration as the module substrate 400 of FIG. 8 and solder pad arrays 403, 404, 405, 406 are different from the solder pad arrays 401, 402 of FIG. 9.

FIG. 10(a) illustrates pads 1000, 1001, 1005 on the lower region 30b of the base substrate of the light emitting apparatus 7 that includes three circuits. To connect the three circuits to each other, the lower region 30b of the base substrate is provided with three sub-pads constituting the first pad 1000, that is, a first sub-pad 1000-1, a second sub-pad 1000-2, and a third sub-pad 1000-3, and with three sub-pads constituting the second pad 1001, that is, a fourth sub-pad 1001-4, a fifth sub-pad 1001-5, and a sixth sub-pad 1001-6. Further, the lower region 30b of the base substrate may be provided with an electrodeless pad array 1005 including six electrodeless pads. Here, FIG. 10(a) shows one example of the electrodeless pad array 1005 including a total of six electrodeless pads 1005-1, 1005-2, 1005-3, 1005-4, 1005-5, 1005-6. Here, the configuration of the pads 1000, 1001, 1005 may be the same as that shown in FIG. 7.

FIG. 10(b) illustrates the solder pad array 403 of the module substrate 400 (see FIG. 8) that connects the three circuits of the light emitting apparatus 7 in series. The solder pad array 403 on the module substrate 400 (see FIG. 8) includes a third-1 solder pad 3-1, a third-2 solder pad 3-2, a third-3 solder pad 3-3, and a third-4 solder pad 3-4.

Here, the third-1 solder pad 3-1 is connected to the first sub-pad 1000-1 through metal bonding; the third-2 solder pad 3-2 is connected to the second sub-pad 1000-2, the fourth sub-pad 1001-4, the first electrodeless pad 1005-1, the second electrodeless pad 1005-2 and the fourth electrodeless pad 1005-4 through metal bonding; the third-3 solder pad 3-3 is connected to the third sub-pad 1000-3, the fifth sub-pad 1001-5, the third electrodeless pad 1005-3, the fifth electrodeless pad 1005-5, and the sixth electrodeless pad 1005-6 through metal bonding; and the third-4 solder pad 3-4 is connected to the sixth sub-pad 1001-6 through metal bonding to form a circuit. Connection of the diagonally located sub-pads to each other through the electrodeless pad array 1005 and the solder pads 3-2, 3-3 can facilitate series connection between the circuits connected to the sub-pads connected to each other. In this way, when series wiring is configured using the electrodeless pad array 1005 under the light emitting apparatuses 7, complex wiring can be simplified while minimizing interference between the circuits through reduction of wiring by the solder pad array 403 on the module substrate 400 (see FIG. 8).

FIG. 10(c) illustrates the solder pad array 404 of the module substrate 400 (see FIG. 8) in which the three circuits are connected to each other in parallel. Here, the solder pad array 404 includes a fourth-1 solder pad 4-1, a fourth-2 solder pad 4-2, and a fourth-3 solder pad 4-3.

Here, the fourth-1 solder pad 4-1 is connected to the first sub-pad 1000-1, the second sub-pad 1000-2, and the third sub-pad 1000-3 through metal bonding, and the fourth-3 solder pad 4-3 is connected to the fourth sub-pad 1001-4, the fifth sub-pad 1001-5, and the sixth sub-pad 1001-6 through metal bonding.

In addition, the first electrodeless pad 1005-1, the second electrodeless pad 1005-2, the third electrodeless pad 1005-3, the fourth electrodeless pad 1005-4, the fifth electrodeless pad 1005-5, and the sixth electrodeless pad 1005-6 may be connected to the fourth-2 solder pad 4-2. In this embodiment, in order to increase the heat dissipation area, some electrodeless pads of the electrodeless pad array 1005 may be connected to at least a region of the fourth-1 solder pad 4-1 or the fourth-3 solder pad 4-3 through metal bonding. When the sub-pads are connected in parallel using the electrodeless pad array 1005 in this way, connection between the circuits can be made under the light emitting apparatus 7 to reduce the wiring area of the module substrate 400 (see FIG. 8), thereby improving luminous uniformity through reduction in the gap between the light emitting apparatuses 7. Furthermore, connection between the electrodeless pad array 1005 and the solder pad array 404 can improve heat dissipation through increase in metal bonding area to allow driving of the circuits at high current while improving reliability of the light emitting apparatus 7 and a light emitting module including the same.

FIG. 10(d) illustrates the solder pad array 405 of the module substrate 400 (see FIG. 8) in which two of the three circuits are connected to each other in series and are also connected to one circuit in parallel to form series-parallel circuitry. In this embodiment, the solder pad array 405 includes a fifth-1 solder pad 5-1, a fifth-2 solder pad 5-2, a fifth-3 solder pad 5-3, and a fifth-4 solder pad 5-4.

To connect two circuits in series, the fifth-2 solder pad 5-2 is connected to the second sub-pad 1000-2 and the fourth sub-pad 1001-4, the first electrodeless pad 1005-1, the second electrodeless pad 1005-2, and the fourth electrodeless pad 1005-4 through metal bonding. To connect the series-connected circuits to another circuit, the fifth-1 solder pad 1005-1 is connected to the first sub-pad 1000-1 and the third sub-pad 1000-3 through metal bonding, and the fifth-3 solder pad 5-3 is connected to the fifth sub-pad 1001-5 and the sixth sub-pad 1001-6 through metal bonding. Here, a region of the fifth-1 solder pad 5-1 may not be located on the lower region 30b of the base substrate. Since complex connection between the circuits can be simplified through the electrodeless pad array 1005, circuit design can be facilitated. In addition, this configuration allows consumers to easily change circuit connection as needed, thereby improving design freedom of the module substrate 400 (see FIG. 8).

Metal bonding of at least one of the third electrodeless pad 1005-3, the fifth electrodeless pad 1005-5, or the sixth electrodeless pad 1005-6, which does not participate in circuit connection, to at least one of the fifth solder pad 5-1, the fifth solder pad 5-2 or the fifth solder pad 5-3, or to an additionally constructed fifth solder pad 5-4 can improve heat dissipation characteristics through increase in metal bonding area, thereby improving reliability of the light emitting apparatus 7 and the light emitting module including the same.

FIG. 10(e) illustrates the solder pad array 406 of the module substrate 400 (see FIG. 8) in which one circuit of the three circuits is connected in series-parallel to two circuits connected to each other in parallel. In this embodiment, the solder pad array 406 includes a sixth-1 solder pad 6-1, a sixth-2 solder pad 6-2, a sixth-3 solder pad 6-3, and a sixth-4 solder pad 6-4.

The sixth-1 solder pad 6-1 is connected to the first sub-pad 1000-1 through metal bonding and the sixth-2 solder pad 6-2 is connected to the second sub-pad 1000-2, the third sub-pad 1000-3, the fourth sub-pad 1001-4, the first electrodeless pad 1005-1, the second electrodeless pad 1005-2, and the fourth electrodeless pad 1005-4 through metal bonding. In addition, the sixth-3 solder pad 6-3 is connected to the fifth sub-pad 1001-5 and the sixth sub-pad 1001-6 through metal bonding. By connecting one-series and two-parallel circuits through the electrodeless pad array 1005, that is, by connecting one circuit in series to two circuits connected to each other in parallel, a complex circuit can be constructed in a small area and the gap between the light emitting apparatuses 7 can be narrowed, thereby improving luminous uniformity of the light emitting module.

Here, when some electrodeless pads among the third electrodeless pad 1005-3, the fifth electrodeless pad 1005-5, and the sixth electrodeless pad 1005-6, which are not used in circuit connection, are connected to one of the sixth-2 solder pads 6-2 and the sixth-3 solder pads 6-3 or to an additionally constructed sixth-4 solder pad 6-4 to optimize the metal bonding area, the heat dissipation characteristics of the light emitting apparatus 7 and the light emitting module including the same can be improved together with reliability of the circuits of the light emitting apparatus 7.

In addition, in the module substrate 400 (see FIG. 8), one or more circuits of each light emitting apparatus 1 can be driven independently to allow local dimming, thereby improving quality of a display through reduction in blooming. Further, a light profile can be adjusted to a narrow beam angle and a wide beam angle light profile by adjusting a light-emitting area through partial driving of the circuits.

Furthermore, three or more circuits can be connected in series, parallel, or series-parallel through the sub-pads and the electrodeless pad array by the method described above.

For example, in order to connect the first circuit and the second circuit among the plural circuit in series, the sub-pads of the first pad connected to one electrode of the first circuit are connected to an external power source or another circuit using the solder pads of the module substrate, and the sub-pads of the second pad connected to the other electrode of the first circuit are connected to the sub-pads of the first pad connected to one electrode of the second circuit using the electrodeless pads through metal bonding. Here, the other electrode of the second circuit may be connected to another circuit or connected to an external power source to form series circuitry in which the first circuit and the second circuit are connected in series.

In addition, in order to connect some of the plurality of circuits in parallel, it is possible to construct a parallel circuit configuration through metal bonding between the sub-pads with the same polarity using the solder pads of the module substrate. For example, in order to connect the first circuit to the second circuit in parallel, the sub-pads of the first pad connected to one electrode of the first circuit may be connected to the sub-pads of the first pad connected to one electrode of the second circuit through metal bonding and the sub-pads of the second pad connected to the other electrode of the first circuit may be connected to the sub-pads of the second pad connected to the other electrode of the second circuit through metal bonding to form parallel circuitry in which the first circuit and the second circuit are connected to each other in parallel.

In addition, metal bonding of the sub-pads, the electrodeless pads, and the solder pads for series connection or parallel connection to the sub-pads and the electrodeless pads connected to the series or parallel circuits described above is added to construct series-parallel circuitry through the series or parallel connection method described above, thereby enabling flexible and easy circuit design.

Furthermore, the electrodeless pads of the electrodeless pad array, which are not used in connection of the circuits, may be used as heat dissipation pads to improve heat dissipation of the light emitting apparatus and the light emitting module including the same. To this end, the solder pads may be used to allow partial metal bonding of some of the electrodeless pads to the first pad and the second pad or to allow metal bonding between the electrodeless pads, thereby enabling design with an optimized heat dissipation area.

The light emitting apparatus in which circuits are connected to one another through the sub-pads and the electrodeless pads can facilitate connection between the plurality of circuits through connection between the electrode pads and the electrodeless pads on the lower region of the base substrate even without complex connection between the circuits on the upper region of the base substrate.

According to embodiments of the present disclosure, construction of circuits using a light emitting apparatus including sub-pads and electrodeless pads realized in arrays can reduce a process of designing a separate circuit on the upper region of the base substrate and allows series, parallel, or series-parallel connection of the circuits to the module substrate 400, as needed, thereby reducing difficulty in circuit design of the module substrate and design costs. In addition, since the electrodeless pad array allows connection between the circuits on the lower region of the base substrate through simple wiring, the gap between the light emitting apparatuses on the module substrate can be narrowed to improve luminous uniformity of the light emitting module, and more light emitting apparatuses can be arranged in a predetermined area to increase the amount of light per unit area of the light emitting module, thereby providing a high-power product.

The detailed description of preferred embodiments of the present disclosure disclosed above has been provided to allow those skilled in the art to implement and practice the present disclosure. Although some embodiments have been described herein, it should be understood by those skilled in the art that various modifications, variations and alterations may be made without departing from the scope of the disclosure. For example, those skilled in the art may utilize each of the configurations described in the above embodiments in combination with each other.

Therefore, it should be understood that the present disclosure is not intended to be limited to the embodiments herein, but rather to provide the broadest scope consistent with principles and novel features disclosed herein.

The invention claimed is:
1. A light emitting apparatus comprising:
a base substrate;
a plurality of circuits disposed on an upper side of the base substrate, wherein at least two of the plurality of circuits are disposed in symmetrical circuit regions on the upper side of the base substrate;
a light emitting source included in at least one circuit among the plurality of circuits;
a first pad and a second pad disposed on a lower side of the base substrate and electrically connected to a first electrode or a second electrode of each of the plurality of circuits; and
an electrodeless pad array disposed on the lower side of the base substrate,
wherein the first electrode includes a plurality of first sub-pads and the second electrode includes a plurality of second sub-pads, wherein a number of the plurality of circuits is N, a number of the plurality of first sub-pads are equal to the number of the plurality of the circuits, and a number of the plurality of second sub-pads are equal to the number of the plurality of the circuits, wherein an electrodeless pad included in the electrodeless pad array and a number of electrodeless pads included in the electrodeless pad array is less than or equal to a product of N and (N−1).

2. The light emitting apparatus according to claim 1, wherein the electrodeless pads are arranged in N rows and (N−1) columns.

3. The light emitting apparatus according to claim 1, wherein the electrodeless pad array has a larger area than the first pad or the second pad.

4. The light emitting apparatus according to claim 1, wherein the electrodeless pad array is disposed between the first pad and the second pad.

5. The light emitting apparatus according to claim 1, wherein at least one circuit among the plurality of circuits comprises an integrated circuit (IC) device.

6. The light emitting apparatus according to claim 1, wherein the light emitting source comprises a light source and a wavelength converter converting a dominant wavelength of light emitted from the light source.

7. The light emitting apparatus according to claim 1, further comprising:
 a circuit protector covering at least a region of the plurality of circuits.

8. The light emitting apparatus according to claim 7, wherein the circuit protector covers at least a region of the light emitting source and has a light transmittance of 70% or more with respect to a dominant wavelength of light emitted from the light emitting source.

9. The light emitting apparatus according to claim 7, wherein the circuit protector comprises a protection device protecting at least one circuit among the plurality of circuits.

* * * * *